(12) United States Patent
Kingman et al.

(10) Patent No.: US 11,772,354 B1
(45) Date of Patent: Oct. 3, 2023

(54) GLASS FASTENING AND SEALING SYSTEMS

(71) Applicants: David E. Kingman, San Jose, CA (US); Derek C. Scott, Melbourne (AU); Donald R. Monroe, Los Gatos, CA (US); Phil M. Hobson, Menlo Park, CA (US); Juan A. Lazaro, San Jose, CA (US); Ibuki Kamei, Santa Clara, CA (US); John Raff, Menlo Park, CA (US); Stephen B. Lynch, Portola Valley, CA (US); Albert J. Golko, Saratoga, CA (US); Christopher D. Prest, Sunnyvale, CA (US); Dale N. Memering, San Francisco, CA (US); James A. Yurko, Saratoga, CA (US); Christopher D. Jones, Los Gatos, CA (US)

(72) Inventors: David E. Kingman, San Jose, CA (US); Derek C. Scott, Melbourne (AU); Donald R. Monroe, Los Gatos, CA (US); Phil M. Hobson, Menlo Park, CA (US); Juan A. Lazaro, San Jose, CA (US); Ibuki Kamei, Santa Clara, CA (US); John Raff, Menlo Park, CA (US); Stephen B. Lynch, Portola Valley, CA (US); Albert J. Golko, Saratoga, CA (US); Christopher D. Prest, Sunnyvale, CA (US); Dale N. Memering, San Francisco, CA (US); James A. Yurko, Saratoga, CA (US); Christopher D. Jones, Los Gatos, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 17/469,434

(22) Filed: Sep. 8, 2021

Related U.S. Application Data

(60) Continuation of application No. 16/745,571, filed on Jan. 17, 2020, now Pat. No. 11,141,950, which is a
(Continued)

(51) Int. Cl.
*B32B 3/02* (2006.01)
*B32B 7/12* (2006.01)
(Continued)

(52) U.S. Cl.
CPC .................. *B32B 3/06* (2013.01); *B32B 3/04* (2013.01); *B32B 7/02* (2013.01); *B32B 7/022* (2019.01);
(Continued)

(58) Field of Classification Search
None
See application file for complete search history.

(56) References Cited

U.S. PATENT DOCUMENTS

| 2,061,760 | A | 11/1936 | Fisher |
| 2,125,372 | A | 8/1938 | Fox |

(Continued)

FOREIGN PATENT DOCUMENTS

| AT | 506530 A1 | 9/2009 |
| AU | 2006228089 B2 | 9/2008 |

(Continued)

OTHER PUBLICATIONS

Machine Translation of DE-3616468-A, Nov. 1987 (Year: 1987).*
Machine Translation of JP-06071693-A, Mar. 1994 (Year: 1994).*

*Primary Examiner* — Jeffrey A Vonch
(74) *Attorney, Agent, or Firm* — Young Basile Hanlon & MacFarlane, P.C.

(57) ABSTRACT

A glass fastening system includes a glass portion, a support structure defining a recess, a first adhesive layer disposed on
(Continued)

an exterior surface of the glass portion facing the recess in the support structure, a second adhesive layer disposed within the recess of the support structure, and a fastener having a first portion secured to the first adhesive layer and a second portion extending away from the first portion and into the second adhesive layer to secure the glass portion to the support structure.

20 Claims, 11 Drawing Sheets

Related U.S. Application Data division of application No. 15/437,996, filed on Feb. 21, 2017, now Pat. No. 10,562,274.

(60) Provisional application No. 62/298,143, filed on Feb. 22, 2016.

(51) Int. Cl.

| | | |
|---|---|---|
| *B32B 17/10* | (2006.01) | |
| *B32B 3/06* | (2006.01) | |
| *B32B 7/022* | (2019.01) | |
| *B32B 7/023* | (2019.01) | |
| *B32B 7/02* | (2019.01) | |
| *E06B 3/56* | (2006.01) | |
| *B32B 3/04* | (2006.01) | |
| *B60R 1/00* | (2022.01) | |
| *B29C 45/14* | (2006.01) | |
| *E06B 3/64* | (2006.01) | |
| *E06B 3/66* | (2006.01) | |
| *B32B 3/30* | (2006.01) | |
| *B60R 11/00* | (2006.01) | |
| *E04B 2/88* | (2006.01) | |
| *E04B 2/74* | (2006.01) | |
| *B60J 1/00* | (2006.01) | |
| *E06B 3/54* | (2006.01) | |
| *B62D 25/04* | (2006.01) | |
| *E04B 2/96* | (2006.01) | |

(52) U.S. Cl.
CPC ............ *B32B 7/023* (2019.01); *B32B 7/12* (2013.01); *B32B 17/10036* (2013.01); *B32B 17/10165* (2013.01); *B32B 17/10293* (2013.01); *E06B 3/56* (2013.01); *B29C 45/14377* (2013.01); *B29C 2045/14459* (2013.01); *B32B 3/30* (2013.01); *B32B 17/1055* (2013.01); *B32B 17/10541* (2013.01); *B32B 2250/03* (2013.01); *B32B 2250/40* (2013.01); *B32B 2307/412* (2013.01); *B32B 2315/08* (2013.01); *B32B 2375/00* (2013.01); *B32B 2405/00* (2013.01); *B32B 2605/006* (2013.01); *B60J 1/001* (2013.01); *B60J 1/006* (2013.01); *B60R 2011/0022* (2013.01); *B60R 2011/0047* (2013.01); *B62D 25/04* (2013.01); *E04B 2/7435* (2013.01); *E04B 2/7455* (2013.01); *E04B 2/88* (2013.01); *E04B 2/885* (2013.01); *E04B 2/96* (2013.01); *E04B 2002/7472* (2013.01); *E06B 3/5481* (2013.01); *E06B 3/64* (2013.01); *E06B 3/6608* (2013.01); *E06B 3/6621* (2013.01); *Y10T 428/24008* (2015.01); *Y10T 428/2419* (2015.01); *Y10T 428/24174* (2015.01); *Y10T 428/24182* (2015.01); *Y10T 428/24322* (2015.01); *Y10T 428/24331* (2015.01); *Y10T 428/24339* (2015.01); *Y10T 428/24521* (2015.01); *Y10T 428/24562* (2015.01); *Y10T 428/24612* (2015.01); *Y10T 428/24777* (2015.01); *Y10T 428/24942* (2015.01); *Y10T 428/24959* (2015.01); *Y10T 428/24983* (2015.01); *Y10T 428/28* (2015.01); *Y10T 428/2848* (2015.01); *Y10T 428/2852* (2015.01); *Y10T 428/2896* (2015.01)

(56) References Cited

U.S. PATENT DOCUMENTS

| | | | |
|---|---|---|---|
| 2,257,951 A | 10/1941 | Haberstump | |
| 2,302,740 A | 11/1942 | Boicey | |
| 2,359,163 A | 9/1944 | Hervey | |
| 2,403,060 A | 7/1946 | Downes | |
| 2,858,414 A | 10/1958 | Dash | |
| 2,936,050 A | 5/1960 | McLaughlin | |
| 3,425,176 A | 2/1969 | Cairns | |
| 3,427,776 A | 2/1969 | Box | |
| 3,868,804 A | 3/1975 | Tantlinger | |
| 3,967,424 A | 7/1976 | Gates | |
| 3,968,612 A | 7/1976 | Endo et al. | |
| 4,072,340 A | 2/1978 | Morgan | |
| 4,093,304 A | 6/1978 | Ziegler | |
| 4,219,230 A | 8/1980 | Lapine | |
| 4,277,294 A | 7/1981 | Orcutt | |
| 4,292,774 A * | 10/1981 | Mairle | B60J 10/70 |
| | | | 52/464 |
| 4,311,336 A | 1/1982 | Geyer et al. | |
| 4,364,595 A * | 12/1982 | Morgan | B60J 1/10 |
| | | | 296/146.15 |
| 4,500,572 A | 2/1985 | Francis | |
| 4,543,283 A * | 9/1985 | Curtze | B32B 17/10302 |
| | | | 156/107 |
| 4,543,755 A | 10/1985 | Crandell | |
| 4,551,372 A | 11/1985 | Kunert | |
| 4,552,790 A | 11/1985 | Francis | |
| 4,571,278 A | 2/1986 | Kunert | |
| 4,581,276 A | 4/1986 | Kunert et al. | |
| 4,606,159 A | 8/1986 | Kunert | |
| 4,635,415 A | 1/1987 | Schumacher et al. | |
| 4,645,146 A | 2/1987 | Hall | |
| 4,650,240 A | 3/1987 | Rinella | |
| 4,680,206 A | 7/1987 | Yoxon et al. | |
| 4,691,489 A | 9/1987 | Shea, Jr. | |
| 4,723,809 A * | 2/1988 | Kida | B60J 1/10 |
| | | | 52/208 |
| 4,738,065 A | 4/1988 | Crandell | |
| 4,793,112 A | 12/1988 | Sufke | |
| 4,799,344 A | 1/1989 | Francis | |
| 4,799,346 A | 1/1989 | Bolton et al. | |
| 4,817,347 A | 4/1989 | Hand et al. | |
| 4,839,122 A | 6/1989 | Weaver | |
| 4,861,540 A * | 8/1989 | Nieboer | B60J 10/265 |
| | | | 264/263 |
| 4,879,853 A | 11/1989 | Braendle et al. | |
| 4,891,732 A | 1/1990 | Jones | |
| 4,893,443 A | 1/1990 | Haber | |
| 4,905,432 A | 3/1990 | Romie | |
| 4,905,435 A | 3/1990 | Horst | |
| 4,933,032 A | 6/1990 | Kunert | |
| 4,938,521 A | 7/1990 | Kunert | |
| 4,994,315 A | 2/1991 | Schreiber et al. | |
| 5,014,934 A | 5/1991 | McClaflin | |
| 5,027,567 A | 7/1991 | Roberts | |
| 5,042,871 A | 8/1991 | Gotanda et al. | |
| 5,057,354 A | 10/1991 | Kunert et al. | |
| 5,062,248 A * | 11/1991 | Kunert | B60J 10/265 |
| | | | 52/394 |
| 5,085,021 A * | 2/1992 | Kunert | B29C 48/155 |
| | | | 52/204.591 |
| 5,095,669 A | 3/1992 | Kunert et al. | |
| 5,137,770 A | 8/1992 | Rothe et al. | |
| 5,138,804 A | 8/1992 | Roberts | |
| 5,152,650 A | 10/1992 | Kitagawa | |
| 5,170,602 A | 12/1992 | Ribic | |

(56) References Cited

U.S. PATENT DOCUMENTS

| | | | |
|---|---|---|---|
| 5,185,979 A | 2/1993 | Azzimonti | |
| 5,199,236 A | 4/1993 | Allen | |
| 5,261,718 A | 11/1993 | Ohlenforst et al. | |
| 5,300,171 A | 4/1994 | Braun et al. | |
| 5,301,484 A * | 4/1994 | Jansson | E04F 13/145 |
| | | | 52/235 |
| 5,331,784 A | 7/1994 | Agrawal et al. | |
| 5,381,637 A | 1/1995 | Farag | |
| 5,384,995 A | 1/1995 | Kunert et al. | |
| 5,391,411 A | 2/1995 | Rowland et al. | |
| 5,391,416 A | 2/1995 | Kunert | |
| 5,398,452 A | 3/1995 | Schilde et al. | |
| 5,421,130 A | 6/1995 | Weber et al. | |
| 5,429,858 A | 7/1995 | Gold | |
| 5,475,956 A * | 12/1995 | Agrawal | B29C 66/961 |
| | | | 52/511 |
| 5,493,831 A | 2/1996 | Jansson | |
| 5,503,684 A | 4/1996 | Duran | |
| 5,519,979 A | 5/1996 | Kunert et al. | |
| 5,522,636 A | 6/1996 | Kolar, Jr. | |
| 5,524,404 A | 6/1996 | Lahaye | |
| 5,527,083 A | 6/1996 | Kreye | |
| 5,540,514 A | 7/1996 | Demars et al. | |
| 5,544,458 A * | 8/1996 | Fisher | B60J 1/10 |
| | | | 52/204.591 |
| 5,592,795 A | 1/1997 | Rinehart et al. | |
| 5,601,328 A | 2/1997 | Bruhnke et al. | |
| 5,620,794 A | 4/1997 | Burkart et al. | |
| 5,635,281 A * | 6/1997 | Agrawal | B60J 10/15 |
| | | | 52/801.1 |
| 5,676,898 A * | 10/1997 | Yokota | B29C 45/14434 |
| | | | 264/263 |
| 5,711,119 A | 1/1998 | Cornils et al. | |
| 5,723,196 A | 3/1998 | Cornils et al. | |
| 5,760,744 A | 6/1998 | Sauer | |
| 5,787,662 A | 8/1998 | Danz | |
| 5,804,719 A | 9/1998 | Didelot et al. | |
| 5,806,257 A | 9/1998 | Cornils et al. | |
| 5,851,470 A | 12/1998 | Yokota et al. | |
| 5,864,996 A | 2/1999 | Veldman et al. | |
| 5,935,356 A | 8/1999 | Soldner | |
| 5,988,730 A | 11/1999 | Bekaert | |
| 6,086,138 A * | 7/2000 | Xu | B60J 1/10 |
| | | | 52/204.591 |
| 6,120,274 A * | 9/2000 | Gerig | B29C 45/14377 |
| | | | 425/127 |
| 6,136,122 A * | 10/2000 | Boaz | B60J 1/006 |
| | | | 156/245 |
| 6,136,427 A | 10/2000 | Boaz | |
| 6,138,434 A | 10/2000 | Demars et al. | |
| 6,179,940 B1 | 1/2001 | Escobar-Y-Gamboa et al. | |
| 6,209,946 B1 * | 4/2001 | Eng | B62D 25/04 |
| | | | 52/204.591 |
| 6,220,650 B1 | 4/2001 | Davis et al. | |
| 6,235,984 B1 | 5/2001 | Wambach et al. | |
| 6,254,397 B1 | 7/2001 | Elmer | |
| 6,309,755 B1 | 10/2001 | Matsco et al. | |
| 6,316,099 B1 | 11/2001 | George et al. | |
| 6,347,491 B1 * | 2/2002 | Legrand | F16B 5/0258 |
| | | | 52/204.5 |
| 6,412,225 B1 | 7/2002 | McManus | |
| 6,609,350 B1 | 8/2003 | Weber | |
| 6,811,857 B1 * | 11/2004 | Bravet | B29C 45/14811 |
| | | | 428/297.1 |
| 6,862,851 B2 | 3/2005 | Burnside et al. | |
| 7,000,356 B2 | 2/2006 | Tamai et al. | |
| 7,040,063 B2 | 5/2006 | Leconte | |
| 7,553,536 B1 | 6/2009 | Naoumenko et al. | |
| 7,960,854 B2 | 6/2011 | Paulus et al. | |
| 8,427,381 B2 | 4/2013 | Labrot et al. | |
| 8,810,462 B2 | 8/2014 | Goldberger | |
| 2001/0023562 A1 | 9/2001 | Blobaum et al. | |
| 2001/0030449 A1 | 10/2001 | De Paoli | |
| 2002/0020119 A1 | 2/2002 | Oberhofer et al. | |
| 2002/0031398 A1 | 3/2002 | Ginzel | |
| 2002/0069590 A1 | 6/2002 | Repp et al. | |
| 2002/0092601 A1 * | 7/2002 | Sweeney, Jr. | B60J 10/34 |
| | | | 156/108 |
| 2002/0148255 A1 | 10/2002 | Vandal et al. | |
| 2003/0057660 A1 | 3/2003 | Ortmuller et al. | |
| 2004/0003555 A1 | 1/2004 | Lhoest | |
| 2004/0006939 A1 | 1/2004 | Jobs et al. | |
| 2004/0068943 A1 | 4/2004 | Morgan et al. | |
| 2004/0145214 A1 | 7/2004 | Farrar et al. | |
| 2004/0183413 A1 | 9/2004 | Koo | |
| 2004/0251713 A1 | 12/2004 | Nania | |
| 2005/0077683 A1 | 4/2005 | Comert et al. | |
| 2005/0144862 A1 | 7/2005 | Jackson et al. | |
| 2005/0188634 A1 | 9/2005 | Bolton et al. | |
| 2005/0221062 A1 | 10/2005 | Mann | |
| 2006/0005482 A1 | 1/2006 | Bennison et al. | |
| 2006/0099833 A1 | 5/2006 | Mann | |
| 2006/0101737 A1 | 5/2006 | Platz | |
| 2006/0157890 A1 * | 7/2006 | Amano | B29C 45/14434 |
| | | | 52/204.5 |
| 2006/0179786 A1 | 8/2006 | Kreye | |
| 2006/0260234 A1 * | 11/2006 | Suare | E06B 3/5436 |
| | | | 52/309.2 |
| 2006/0272227 A1 | 12/2006 | Doeppner | |
| 2006/0292380 A1 | 12/2006 | Mann | |
| 2007/0063539 A1 * | 3/2007 | DiMario | B60J 1/006 |
| | | | 248/216.4 |
| 2007/0071572 A1 | 3/2007 | Bohnet et al. | |
| 2007/0190282 A1 | 8/2007 | Erban | |
| 2008/0053023 A1 | 3/2008 | Stenvall | |
| 2008/0081148 A1 | 4/2008 | Bond | |
| 2008/0213545 A1 | 9/2008 | Allam et al. | |
| 2009/0077921 A1 | 3/2009 | Carbary et al. | |
| 2009/0174300 A1 | 7/2009 | Jousse et al. | |
| 2009/0191375 A1 | 7/2009 | Bankwitz et al. | |
| 2009/0260742 A1 | 10/2009 | Schmatloch et al. | |
| 2009/0309391 A1 | 12/2009 | Krause | |
| 2010/0024328 A1 * | 2/2010 | Bissinger | B60J 1/006 |
| | | | 403/338 |
| 2010/0059253 A1 | 3/2010 | Labrot et al. | |
| 2010/0166987 A1 * | 7/2010 | Bodin | B60J 1/006 |
| | | | 264/277 |
| 2010/0243047 A1 | 9/2010 | Kuster et al. | |
| 2010/0294121 A1 | 11/2010 | Kachtan | |
| 2012/0024349 A1 | 2/2012 | Berens | |
| 2012/0129401 A1 | 5/2012 | Corneille et al. | |
| 2012/0132245 A1 | 5/2012 | Kim | |
| 2012/0159880 A1 | 6/2012 | Veilleux et al. | |
| 2012/0169196 A1 | 7/2012 | Marchetti et al. | |
| 2013/0033894 A1 | 2/2013 | Kleo et al. | |
| 2013/0086855 A1 * | 4/2013 | Grandgirard | B29C 45/14434 |
| | | | 52/204.591 |
| 2013/0140844 A1 | 6/2013 | Bennett | |
| 2013/0140847 A1 | 6/2013 | Altes et al. | |
| 2013/0214555 A1 * | 8/2013 | Ackerman | B60J 10/15 |
| | | | 156/107 |
| 2013/0323481 A1 | 12/2013 | Gasworth | |
| 2013/0327372 A1 | 12/2013 | Pfennig et al. | |
| 2013/0330495 A1 | 12/2013 | Maatta et al. | |
| 2014/0007510 A1 * | 1/2014 | Salzmann | E06B 7/24 |
| | | | 49/495.1 |
| 2014/0026502 A1 | 1/2014 | Carbary et al. | |
| 2014/0079474 A1 | 3/2014 | Andreini et al. | |
| 2014/0084117 A1 | 3/2014 | Frias | |
| 2014/0178635 A1 | 6/2014 | Imaizumi et al. | |
| 2014/0216526 A1 | 8/2014 | Doech et al. | |
| 2014/0230354 A1 | 8/2014 | Luck | |
| 2014/0318058 A1 | 10/2014 | Morgan et al. | |
| 2014/0327267 A1 | 11/2014 | Deussen et al. | |
| 2015/0016132 A1 | 1/2015 | Verrat-Debailleul | |
| 2015/0024165 A1 | 1/2015 | Gilde et al. | |
| 2015/0093539 A1 | 4/2015 | Krugmann et al. | |
| 2015/0300784 A1 | 10/2015 | Scarinci et al. | |
| 2016/0017596 A1 | 1/2016 | Ballesteros et al. | |
| 2016/0221256 A1 * | 8/2016 | Rule | B32B 27/10 |
| 2016/0347377 A1 | 12/2016 | Minei | |
| 2017/0009514 A1 | 1/2017 | Gruszecki | |

(56) References Cited

U.S. PATENT DOCUMENTS

| | | |
|---|---|---|
| 2017/0051778 A1 | 2/2017 | Dickinson et al. |
| 2017/0218990 A1 * | 8/2017 | Gonnet .................. B60J 1/005 |
| 2017/0256872 A1 | 9/2017 | Ebert et al. |
| 2017/0298621 A1 | 10/2017 | Frederick |
| 2018/0178482 A1 | 6/2018 | Uebelacker et al. |
| 2019/0390506 A1 | 12/2019 | Gagne et al. |

FOREIGN PATENT DOCUMENTS

| | | | | |
|---|---|---|---|---|
| CA | 1197886 A * | 12/1985 | ............ | B60J 1/10 |
| CN | 2252834 Y | 4/1997 | | |
| CN | 202106819 U | 1/2012 | | |
| CN | 102802938 A | 11/2012 | | |
| CN | 203022545 U | 6/2013 | | |
| CN | 203035016 U | 7/2013 | | |
| CN | 203198695 U | 9/2013 | | |
| DE | 732014 C | 2/1943 | | |
| DE | 1196330 B | 7/1965 | | |
| DE | 7801989 U1 | 7/1979 | | |
| DE | 3409831 A1 | 10/1984 | | |
| DE | 3322442 A1 | 1/1985 | | |
| DE | 3323006 A1 | 1/1985 | | |
| DE | 3439436 A1 | 4/1986 | | |
| DE | 3604389 A1 | 8/1986 | | |
| DE | 3616468 A * | 11/1987 | ............ | B60J 1/005 |
| DE | 3643472 A1 | 12/1987 | | |
| DE | 3717428 A1 | 12/1987 | | |
| DE | 3701808 A1 | 6/1988 | | |
| DE | 3807459 A1 | 9/1988 | | |
| DE | 3832178 A1 | 4/1990 | | |
| DE | 4014200 A1 | 11/1990 | | |
| DE | 4307634 A1 | 3/1994 | | |
| DE | 4325024 A1 | 2/1995 | | |
| DE | 29622574 U1 | 2/1997 | | |
| DE | 19539960 A1 * | 4/1997 | ............ | B60J 1/006 |
| DE | 19543192 A1 | 5/1997 | | |
| DE | 29716365 U1 | 1/1998 | | |
| DE | 19651649 A1 | 6/1998 | | |
| DE | 19710824 C1 | 9/1998 | | |
| DE | 19751124 C1 | 4/1999 | | |
| DE | 19859888 A1 | 7/2000 | | |
| DE | 19929480 A1 | 12/2000 | | |
| DE | 10022250 A1 | 1/2001 | | |
| DE | 19955639 A1 * | 5/2001 | ............ | E06B 3/303 |
| DE | 10052529 A1 | 5/2002 | | |
| DE | 10052538 A1 | 7/2002 | | |
| DE | 10132356 A1 | 1/2003 | | |
| DE | 10232609 A1 | 2/2003 | | |
| DE | 10225140 A1 | 12/2003 | | |
| DE | 20317939 U1 | 2/2004 | | |
| DE | 10333978 A1 | 2/2005 | | |
| DE | 202004017265 U1 | 2/2005 | | |
| DE | 202006007201 U1 | 10/2006 | | |
| DE | 102006027074 A1 | 9/2007 | | |
| DE | 102006019210 A1 | 10/2007 | | |
| DE | 102008023408 A1 | 11/2008 | | |
| DE | 102008006553 A1 | 8/2009 | | |
| DE | 102009020351 A1 | 11/2010 | | |
| DE | 202009010065 U1 | 12/2010 | | |
| DE | 102009033562 A1 * | 1/2011 | ............ | B60J 1/006 |
| DE | 202011001267 U1 | 3/2011 | | |
| DE | 102009044770 A1 | 6/2011 | | |
| DE | 102010018935 A1 | 11/2011 | | |
| DE | 102011015076 A1 | 12/2011 | | |
| DE | 102011050752 A1 * | 1/2012 | ......... | B29C 45/1671 |
| DE | 102011102840 A1 | 12/2012 | | |
| DE | 102011121031 A1 | 6/2013 | | |
| DE | 202014005330 U1 | 10/2014 | | |
| EP | 0128837 A1 | 12/1984 | | |
| EP | 0163195 A2 | 12/1985 | | |
| EP | 0297952 A1 | 1/1989 | | |
| EP | 0319695 A1 | 6/1989 | | |
| EP | 0340089 A1 | 11/1989 | | |
| EP | 0367908 A1 | 5/1990 | | |
| EP | 0368728 A2 | 5/1990 | | |
| EP | 390151 A * | 10/1990 | ....... | B29C 45/14336 |
| EP | 0506522 A1 | 9/1992 | | |
| EP | 526327 A1 * | 2/1993 | ............ | B60J 1/10 |
| EP | 0611854 A1 | 8/1994 | | |
| EP | 0623727 A1 | 11/1994 | | |
| EP | 0695848 A2 | 2/1996 | | |
| EP | 0795431 A1 | 9/1997 | | |
| EP | 0882616 A1 | 12/1998 | | |
| EP | 1297237 A1 | 4/2003 | | |
| EP | 1388622 A1 | 2/2004 | | |
| EP | 1447494 A2 | 8/2004 | | |
| EP | 1449693 A2 | 8/2004 | | |
| EP | 1754844 A2 | 2/2007 | | |
| EP | 1865753 A1 | 12/2007 | | |
| EP | 1881147 A2 | 1/2008 | | |
| EP | 1905934 A2 * | 4/2008 | ............ | E04F 13/145 |
| EP | 1908913 A1 | 4/2008 | | |
| EP | 2006465 A2 | 12/2008 | | |
| EP | 2014734 A1 | 1/2009 | | |
| EP | 2147813 A2 * | 1/2010 | ............ | B60J 1/006 |
| EP | 2339646 A1 | 6/2011 | | |
| EP | 2485275 A1 | 8/2012 | | |
| EP | 2583822 A1 | 4/2013 | | |
| EP | 2190665 B1 | 7/2013 | | |
| EP | 2692979 A1 | 2/2014 | | |
| EP | 2857192 A1 | 4/2015 | | |
| FR | 2577483 A1 | 8/1986 | | |
| FR | 2630157 A1 | 10/1989 | | |
| FR | 2655076 A1 | 5/1991 | | |
| FR | 2657376 A1 | 7/1991 | | |
| FR | 2732730 A1 | 10/1996 | | |
| FR | 2739060 A1 | 3/1997 | | |
| FR | 2746843 A1 | 10/1997 | | |
| FR | 2777316 A1 | 10/1999 | | |
| FR | 2927053 A1 * | 8/2009 | ............ | B60J 1/005 |
| FR | 2974559 A1 | 11/2012 | | |
| FR | 3002528 A1 | 8/2014 | | |
| GB | 2024297 A | 1/1980 | | |
| GB | 2095318 A * | 9/1982 | ............ | E06B 3/5427 |
| GB | 2290577 A * | 1/1996 | ............ | E06B 3/5481 |
| IT | TV-20090186 A1 * | 3/2011 | ............ | B60J 1/10 |
| JP | 58035416 U * | 3/1983 | | |
| JP | 60099769 A | 6/1984 | | |
| JP | 59192615 A | 11/1984 | | |
| JP | 62026115 A * | 2/1987 | | |
| JP | 62199525 A * | 9/1987 | ....... | B29C 45/14336 |
| JP | 63082814 A * | 4/1988 | ....... | B29C 45/14377 |
| JP | 02018112 A | 1/1990 | | |
| JP | 02254013 A * | 10/1990 | ....... | B29C 45/14377 |
| JP | H02254012 A | 10/1990 | | |
| JP | 02276605 A * | 11/1990 | ....... | B29C 45/14336 |
| JP | 03236922 A * | 10/1991 | ....... | B29C 45/14377 |
| JP | 03284412 A | 12/1991 | | |
| JP | 05033565 A | 2/1993 | | |
| JP | 05141027 A | 6/1993 | | |
| JP | 05141152 A | 6/1993 | | |
| JP | 06071693 A * | 3/1994 | ....... | B29C 45/14377 |
| JP | 06156071 A * | 6/1994 | ............ | E06B 3/5481 |
| JP | 06191269 A * | 7/1994 | ............ | B29C 47/92 |
| JP | 06272350 A | 9/1994 | | |
| JP | 06330583 A | 11/1994 | | |
| JP | H08151239 A | 6/1996 | | |
| JP | H09170280 A | 6/1997 | | |
| JP | H09303338 A | 11/1997 | | |
| JP | 2000177383 A | 6/2000 | | |
| JP | 2001252943 A | 9/2001 | | |
| JP | 2002096633 A * | 4/2002 | ............ | B60J 1/006 |
| JP | 2002096634 A | 4/2002 | | |
| JP | 2003039946 A | 2/2003 | | |
| JP | 2005096658 A * | 4/2005 | ............ | B60J 1/006 |
| JP | 2005320214 A | 11/2005 | | |
| JP | 2005350290 A | 12/2005 | | |
| JP | 2006175601 A * | 7/2006 | ............ | B60J 1/006 |
| JP | 2006294646 A | 10/2006 | | |
| JP | 2007039994 A * | 2/2007 | | |
| JP | 2007126067 A | 5/2007 | | |
| JP | 2007177468 A | 7/2007 | | |
| JP | 2013079066 A | 5/2013 | | |
| JP | 2014104790 A | 6/2014 | | |

(56) References Cited

FOREIGN PATENT DOCUMENTS

| | | | | |
|---|---|---|---|---|
| JP | 2014172497 A | | 9/2014 | |
| KR | 2001057985 A | * | 7/2001 | ............ B60J 1/006 |
| KR | 20030033300 A | | 5/2003 | |
| KR | 20050014153 A | | 2/2005 | |
| KR | 2007040487 A | * | 4/2007 | ............ B60J 1/006 |
| KR | 100828460 B1 | | 5/2008 | |
| KR | 101174651 B1 | | 8/2012 | |
| KR | 101497455 B1 | | 3/2015 | |
| KR | 20150052423 A | | 5/2015 | |
| KR | 20150129381 A | | 11/2015 | |
| MX | 2010013548 A | | 6/2011 | |
| TW | 201203757 A | | 1/2012 | |
| WO | 9622443 A1 | | 7/1996 | |
| WO | 9626336 A1 | | 8/1996 | |
| WO | 9717221 A1 | | 5/1997 | |
| WO | WO-9716325 A1 | * | 5/1997 | ............ B60J 1/006 |
| WO | WO-0142036 A1 | * | 6/2001 | ............ B60J 1/008 |
| WO | 2004011755 A1 | | 2/2004 | |
| WO | 2006135365 A1 | | 12/2006 | |
| WO | 2008125737 A1 | | 10/2008 | |
| WO | 2009029897 A2 | | 3/2009 | |
| WO | 2010079142 A2 | | 7/2010 | |
| WO | 2010121666 A2 | | 10/2010 | |
| WO | 2013034978 A2 | | 3/2013 | |
| WO | 2013053345 A1 | | 4/2013 | |
| WO | 2014086914 A1 | | 6/2014 | |

* cited by examiner

GLASS FASTENING AND SEALING SYSTEMS

CROSS-REFERENCE TO RELATED APPLICATIONS

This application is a continuation of U.S. patent application Ser. No. 16/745,571, filed on Jan. 17, 2020, which is a divisional of U.S. patent application Ser. No. 15/437,996, filed on Feb. 21, 2017, which claims the benefit of U.S. Provisional Application No. 62/298,143, filed on Feb. 22, 2016, each of which is incorporated by reference in its entirety.

TECHNICAL FIELD

The application relates generally to joints for glass. More particularly, described embodiments relate to overmolds, seals, masks, and fasteners that are joined with laminated glass during or after the lamination process.

BACKGROUND

Laminated glass, or safety glass, is traditionally formed by bonding either a polyvinyl butyral (PVB) or ethylene-vinyl acetate (EVA) interlayer between two layers of glass. A thin film or layer of PVB or EVA can be placed between two layers of glass, a vacuum can be applied to remove air from between the various layers, and then heat and/or pressure can be applied to bond the layers together, for example, using an autoclave. Laminated glass can be used to dampen sound transmission and increase the level of safety in architectural and automotive applications, for example, to deter shattering of windows during a hurricane or dampen sound entering through the windows of a passenger compartment of a vehicle.

Traditional fastening systems for laminated glass include edge-style frames and c-shaped or u-shaped clamps that surround panes of laminated glass as well as spider-style fittings attached to bore-based fasteners configured to position the corners of multiple pieces of laminated glass adjacent to each other. More elegant fastening solutions are needed to minimize visibility of the fastening system.

SUMMARY

The disclosure relates to glass fastening and sealing systems. In one aspect of the disclosure, a glass fastening system includes a first glass pane, a second glass pane defining a bore, an interlayer disposed between and extending along interior surfaces of the first glass pane and the second glass pane, and a fastener having a first portion disposed along the interlayer between the first glass pane and the second glass pane and a second portion extending outward from an exterior surface of the second glass pane.

In another aspect of the disclosure, a glass fastening system includes a first glass pane, a second glass pane, an interlayer disposed between the glass panes, an adhesive layer disposed along an exterior surface of the second glass pane, and a fastener having a first portion extending along the adhesive layer and a second portion extending from the first portion and away from the exterior surface. The second portion of the fastener is configured to secure the first glass pane and the second glass pane to a support structure.

In another aspect of the disclosure, a glass sealing system includes a first glass portion having a first edge portion, a second glass portion having a second edge portion, an interlayer disposed between the first glass portion and the second glass portion, and a seal comprising an overmold portion capturing the first edge portion and the second edge portion.

In another aspect of the disclosure, a glass sealing system includes a first glass pane, a second glass pane defining a recessed portion and a plurality of bores within the recessed portion, an interlayer disposed between the first glass pane and the second glass pane, and a seal. The seal includes an internal portion extending along and disposed within the recessed portion, an external portion axially aligned with the internal portion and extending along an exterior surface of the second glass pane, and connection portions extending through the bores from the internal portion to the external portion.

BRIEF DESCRIPTION OF THE DRAWINGS

The disclosure will be readily understood by the following detailed description in conjunction with the accompanying drawings, wherein like reference numerals designate like structural elements. A description of the drawings is as follows.

DETAILED DESCRIPTION

The following disclosure relates to glass fastening systems, sealing systems, and support structures. In some examples of fastening systems, fastener portions are embedded between glass panes during a glass lamination process. In other examples of fastening systems, fastener portions are adhered to exterior surfaces of glass panes or magnetically attracted to each other through glass panes. In examples of sealing systems, seals are partially embedded within or encapsulated around edges of laminated glass portions, either during or after the lamination process. In examples of support structures, transparent, ductile support bodies extend between overmold portions to capture and support laminated glass portions.

The glass fastening and sealing systems described below can be implemented in automotive applications, for example, to increase the transparent area of glass surfaces in a vehicle such as the windshield, door windows, backlight, or roof. Embedded fasteners can be used to attach laminated glass directly to underlying body structure, such as an A-, B-, or C-pillar in a vehicle. Embedded or encapsulated seals can be used to abut portions of laminated glass, for example, at a door window to a windshield or a backlight interface, allowing more of the interface to be transparent. Supporting laminated glass portions within a transparent, ductile body can also increase the transparent area of various glass vehicle surfaces.

Figure 1:
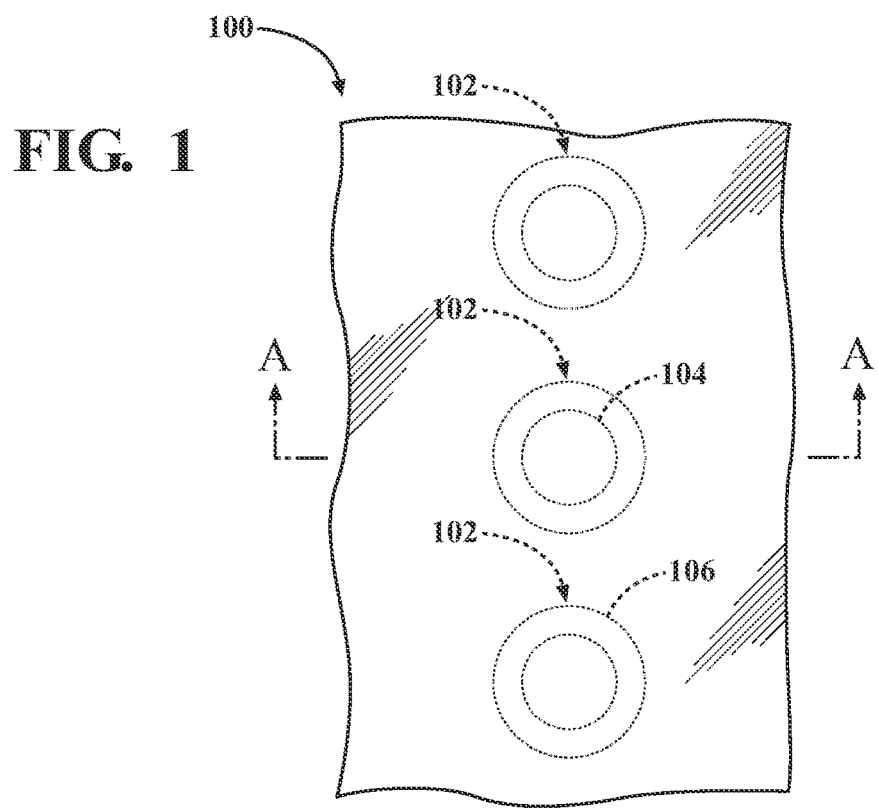
FIG. 1 shows a top view of laminated glass including a fastening system.

FIG. 1 shows a top view of laminated glass 100 including an example of a fastening system. As seen in the top view, multiple fasteners 102 are included in the fastening system, each including a fastener portion 104 embedded within or adhered to the laminated glass 100 and a fastener portion 106 configured to couple with the embedded or adhered fastener portion 104, for example, in association with a structure to which the laminated glass 100 is connected, such as a vehicle pillar or a door frame. A section, A-A, is shown as extending through a central fastener 102 in the fastening system. Sectional views through section A-A for various examples of the fastener 102 are described in conjunction with FIGS. 2-4 below.

Figure 2:
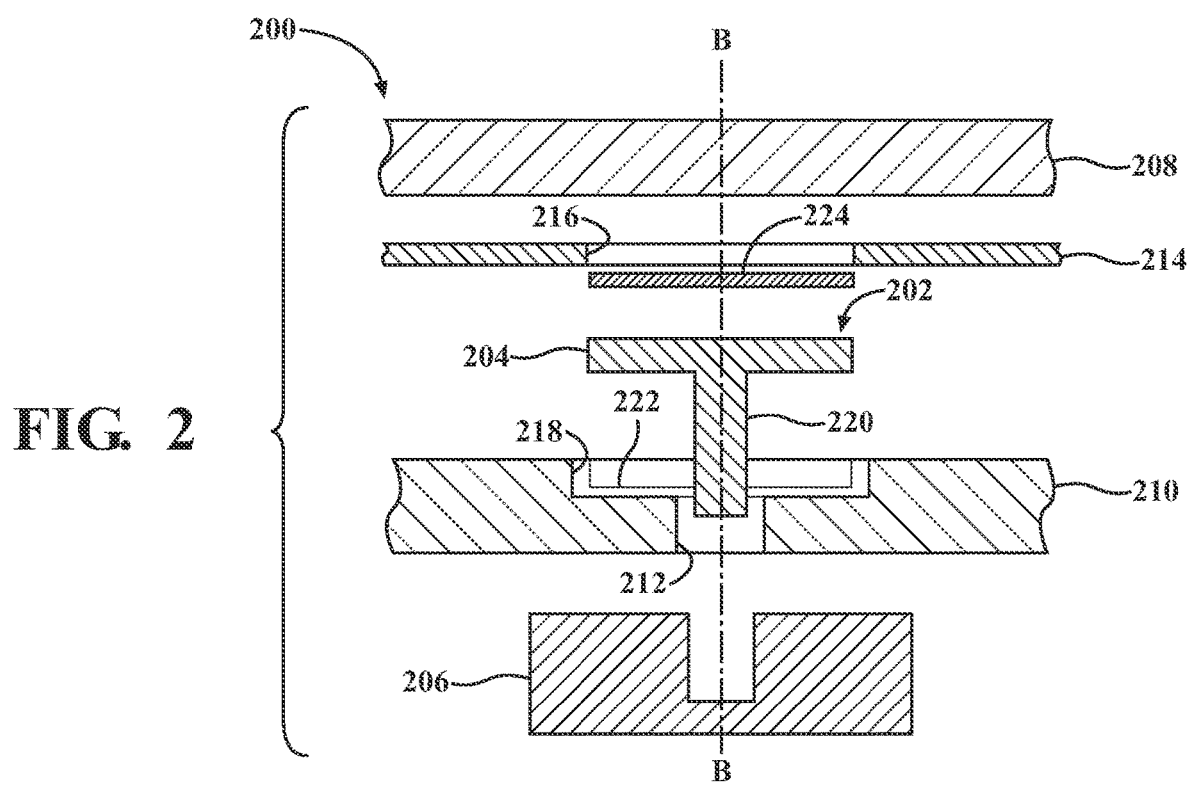
FIG. 2 shows an exploded sectional view of a fastener embedded in a portion of the laminated glass of FIG. 1 during glass lamination.

FIG. 2 shows an exploded sectional view of a fastener 202 embedded in a laminated glass portion 200 during the lamination process. The laminated glass portion 200 can be part of the laminated glass 100 of FIG. 1. The sectional view of laminated glass portion 200 includes a first glass pane 208 and a second glass pane 210. The second glass pane 210 defines a bore 212. The laminated glass portion 200 also includes an interlayer 214 defining another bore 216, the bore 216 in the interlayer 214 being axially aligned with the bore 212 in the second glass pane 210, for example, along axis B. The interlayer 214 is disposed between the first glass pane 208 and the second glass pane 210 and extends along interior surfaces of the first glass plane 208 and the second glass pane 210 so as to couple the first and second glass panes 208, 210. The interlayer 214 can include a pressure-based adhesive and/or a thermally-activated adhesive configured to join the first glass pane 208 and the second glass pane 210 during the lamination process.

The fastener 202 in the laminated glass fastening system of FIG. 2 includes a fastener portion 204 disposed at least partially within the bore 216 in the interlayer 214 once the lamination process is complete. The second glass pane 210 can also include a relief portion 218 formed, for example, by grinding or machining. The relief portion 218 is configured both to avoid an increase in thickness in the laminated glass portion 200 and to assist in locating the fastener portion 204 before the lamination process. Thus, the fastener portion 204 becomes captured, or sandwiched, between the first glass pane 208 and the second glass pane 210 once lamination is complete. The fastener 202 also includes a fastener portion 220 extending from the fastener portion 204 and through the bore 212 in the second glass pane 210. The fastener portion 220 can extend below a bottom surface of the second glass pane 210 after the lamination process is complete.

The fastener 202 also includes a fastener portion 206 configured to capture the fastener portion 220 that extends through the bore 212 beyond the bottom surface of the second glass pane 210. In this example, the fastener portion 206 is a female portion and the fastener portion 220 is a male portion, though other configurations are also possible. The fastener portion 206 can be disposed in, extend through, or generally be associated with a structure such that connection of the fastener portion 220 with the fastener portion 206 couples the laminated glass portion 200 to the underlying structure.

The lamination process can include placing a compliant layer 222 between the fastener portion 204 and the relief portion 218 of the second glass pane 210. The compliant layer 222 can be deformable and configured to dissipate clamp loads between the fastener 202 and the second glass pane 210 since machining or grinding the relief portion 218 can create additional stress on the laminated glass portion 200. Though the compliant layer 222 is shown as located within the relief portion 218, the fastener 202 could alternatively be designed to include the compliant layer 222.

The lamination process for embedding the fastener 202 of FIG. 2 can also include placing a conductive layer 224 between the first glass pane 208 and the fastener portion 204, the conductive layer 224 being configured to transmit energy through the fastener 202. In one example, the conductive layer 224 can be designed to collect solar energy. In another example, the conductive layer 224 can be designed to transmit electricity in order to power devices associated with the laminated glass portion 200, such as lights, sensors, etc. In some cases, these devices can be part of the embedded fastener 202.

Figure 3:
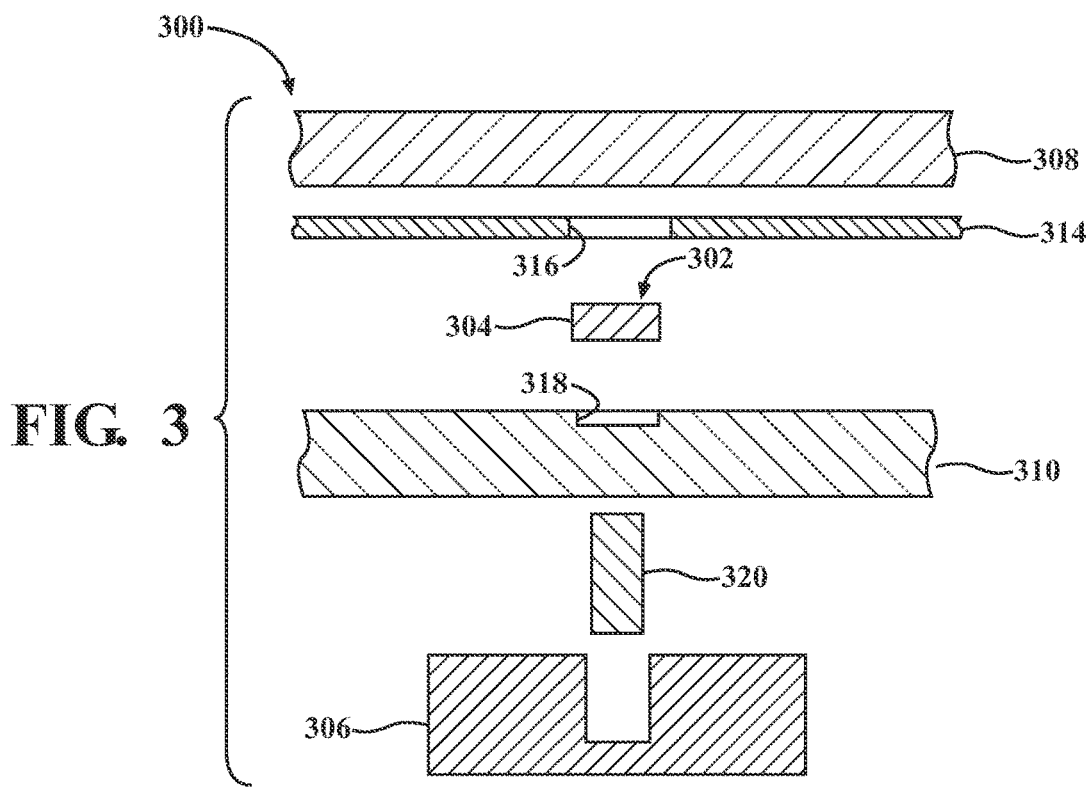
FIG. 3 shows an exploded sectional view of another fastener embedded in a portion of the laminated glass of FIG. 1 during glass lamination.

FIG. 3 shows an exploded sectional view of another fastener 302 embedded in a laminated glass portion 300 during the lamination process. The laminated glass portion 300 can be part of the laminated glass 100 of FIG. 1. The sectional view of the laminated glass portion 300 includes a first glass pane 308 and a second glass pane 310. The laminated glass portion 300 also includes an interlayer 314 defining a bore 316. The interlayer 314 is disposed between the first glass pane 308 and the second glass pane 310 and extends along interior surfaces of the first glass plane 308 and the second glass pane 310 so as to couple the first and second glass panes 308, 310. The interlayer 314 can include a pressure-based adhesive and/or a thermally-activated adhesive configured to join the first glass pane 308 and the second glass pane 310 during the lamination process.

The fastener 302 in the laminated glass fastening system of FIG. 3 includes a fastener portion 304 disposed at least partially within the bore 316 in the interlayer 314 once the lamination process is complete. To aid in locating the fastener portion 304 during the lamination process and avoid an increase in overall thickness, the second glass pane 310 can include a relief portion 318 formed, for example, by grinding or machining. The fastener portion 304 becomes captured, or sandwiched, between the first glass pane 308 and the second glass pane 310 once lamination is complete, nestled within the bore 316 and the relief portion 318.

The fastener 302 also includes a fastener portion 320 disposed on an exterior surface of the second glass pane 310. The fastener portion 320 can be aligned with the fastener portion 304 after the lamination process is complete by having one of the fastener portion 304 and the fastener portion 320 formed of a magnetic material and the other of the fastener portion 304 and the fastener portion 320 formed of a magnetically attractable material, that is, the two fastener portions 304, 320 are attracted magnetically.

The magnet, be it part of the fastener portion 304 or the fastener portion 320, can be designed to have sufficient strength to allow the fastener portion 320 to be further coupled to the separate fastener portion 306. The fastener portion 306 is configured to capture the fastener portion 320. In this example, the fastener portion 306 is a female portion and the fastener portion 320 is a male portion, though other configurations are also possible. In a similar manner as described in respect to FIG. 2, the fastener portion 306 can be disposed in, extend through, or generally be associated with a structure such that connection of the fastener portion 320 with the fastener portion 306 couples the laminated glass portion 300 to the underlying structure.

Figure 4:
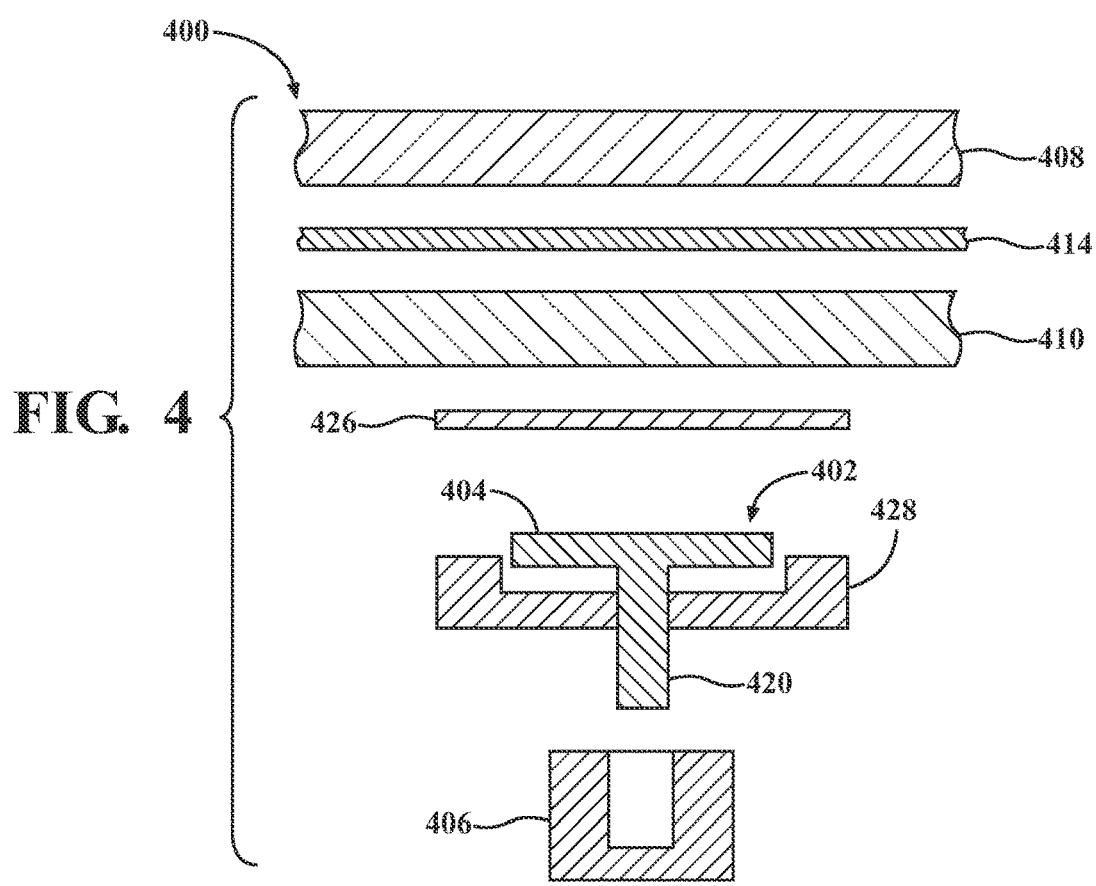
FIG. 4 shows an exploded sectional view of another fastener adhered to a portion of the laminated glass of FIG. 1.

FIG. 4 shows an exploded sectional view of another fastener 402 adhered to a laminated glass portion 400. The laminated glass portion 400 can be part of the laminated glass 100 of FIG. 1. The laminated glass portion 400 includes a first glass pane 408, a second glass pane 410, and an interlayer 414 disposed between the first glass pane 408 and the second glass pane 410. As in previous examples, the interlayer 414 joins the first glass pane 408 and the second glass pane 410 during the lamination process. A fastener 402 is attached to the second glass pane 410 using an adhesive 426, the adhesive being disposed on an exterior surface of the second glass pane 410. Alternatively, the adhesive 426 can be applied to the fastener 402 before attachment to the laminated glass portion 400.

Specifically, the fastener 402 includes a fastener portion 404 that is disposed on and extends for the length of the adhesive 426 and a fastener portion 420 extending away from the fastener portion 404 and away from an exterior surface of the second glass pane 410. Optionally, the fastener portion 404 can include, comprise, or be contained within a glass housing 428, or at least formed of a glass material. In this example, the adhesive 426 connects two glass surfaces together. Using a glass housing 428 or a glass material in association with the fastener portion 404 provides additional structure and strength to the fastener 402 while at the same time minimizing stress to the laminated glass portion 400 and maintaining transparency.

The fastener 402 can also include a fastener portion 406 configured to capture the fastener portion 420. In this example, the fastener portion 406 is a female portion and the fastener portion 420 is a male portion, though other configurations are also possible. In a similar manner as described in respect to FIGS. 2 and 3, the fastener portion 406 can be disposed in, extend through, or generally be associated with a structure such that connection of the fastener portion 420 with the fastener portion 406 couples the laminated glass portion 400 to the underlying structure.

Figure 5:
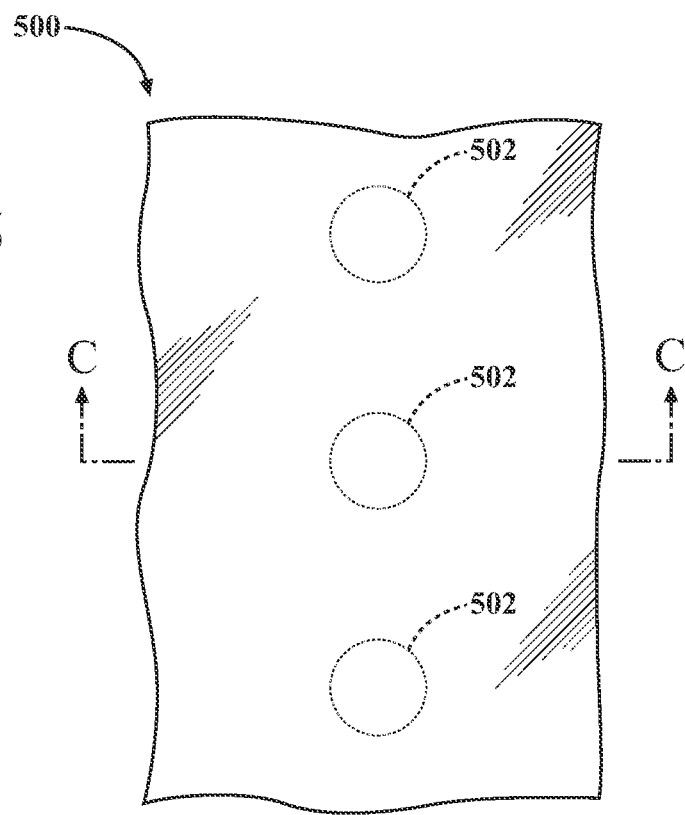
FIG. 5 shows a top view of laminated glass including another type of fastening system.

FIG. 5 shows a top view of laminated glass 500 including another type of fastening system. As seen in this top view, multiple fasteners 502 are included in the fastening system, portions of the fasteners 502 being present on a top surface of the laminated glass 500. A section, C-C, is shown as extending through a central fastener 502 in the fastening system. A sectional view along section C-C through a fastener similar to one of the fasteners 502 is described in conjunction with FIG. 6 below.

Figure 6:
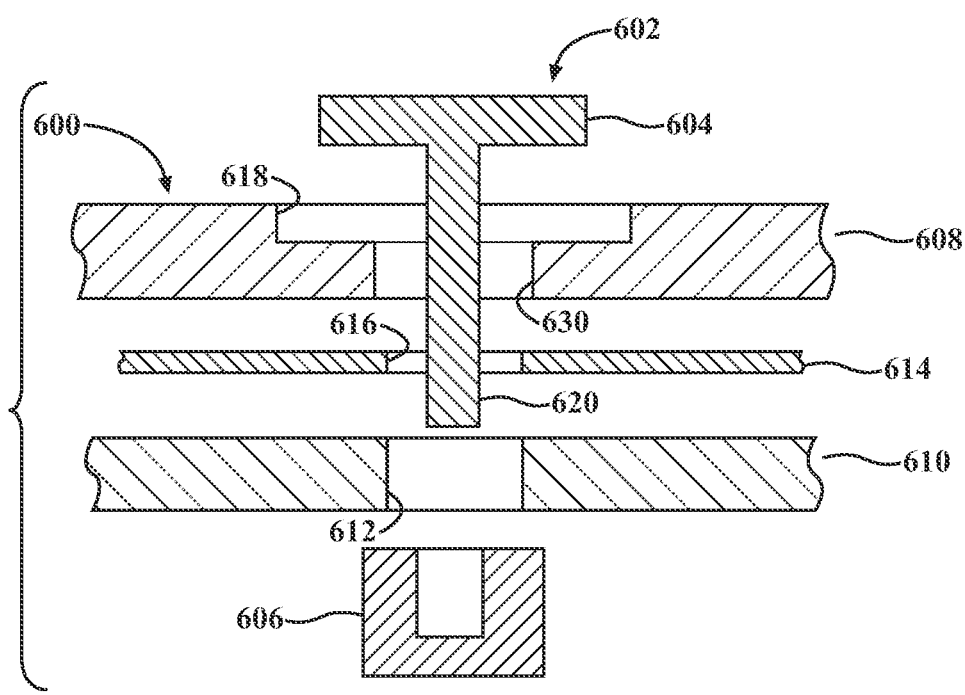
FIG. 6 shows an exploded sectional view of a fastener extending through a portion of the laminated glass of FIG. 5.

FIG. 6 shows an exploded sectional view of a fastener 602 extending through a laminated glass portion 600. The laminated glass portion 600 can be part of the laminated glass 500 of FIG. 5. The laminated glass portion 600 includes a first glass pane 608 having a relief portion 618 and defining a bore 630, a second glass pane 610 defining a bore 612, and an interlayer 614 defining a bore 616. The bores 612, 616, 630 are axially aligned and the interlayer 614 is disposed between the first glass pane 608 and the second glass pane 610.

The fastener 602 includes a fastener portion 604 at least partially disposed within the relief portion 618 within the first glass pane 608 and a fastener portion 620 extending from the fastener portion 604 through all three bores 612, 616, 630. The fastener 602 also includes a fastener portion 606 configured to capture the fastener portion 620. In FIG. 6, the fastener portion 620 is shown as a male portion and the fastener portion 606 is shown as a female portion, though other configurations are possible. For example, the fastener portion 606 can at least partially extend through the bore 612 to capture the fastener portion 620. The fastener portion 606 can extend from or be captured within a support structure, such as a vehicle pillar or a door frame.

In operation, the laminated glass portion 600 can be machined, drilled, bored, etc. either before or after the lamination process, and the fastener portion 606 can be associated with or make contact with an underlying structure in order to join the laminated glass portion 600 to the structure. In the example of FIG. 6, the fastener portion 604 is designed so as to be flush with an outer surface of the first glass pane 608 after connection of the laminated glass portion 600 to the structure.

Figure 7:
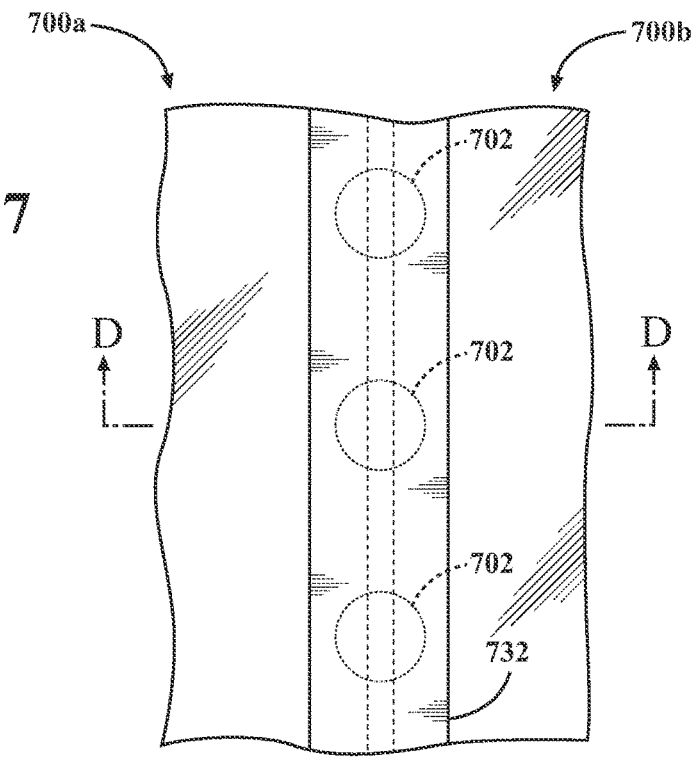
FIG. 7 shows a top view of a juncture for two portions of laminated glass including another type of fastening system.

FIG. 7 shows a top view of a juncture for two laminated glass portions 700a,b including another type of fastening system. As seen in the top view, multiple fasteners 702 are included in the fastening system, portions of the fasteners 702 being present on a top surface of a trim element 732 used to clamp the two laminated glass portions 700a,b together. A section, D-D, is shown as extending through a central fastener 702 in the fastening system. A sectional view through section D-D of a fastener similar to one of the fasteners 702 is described in conjunction with FIG. 8 below.

Figure 8:
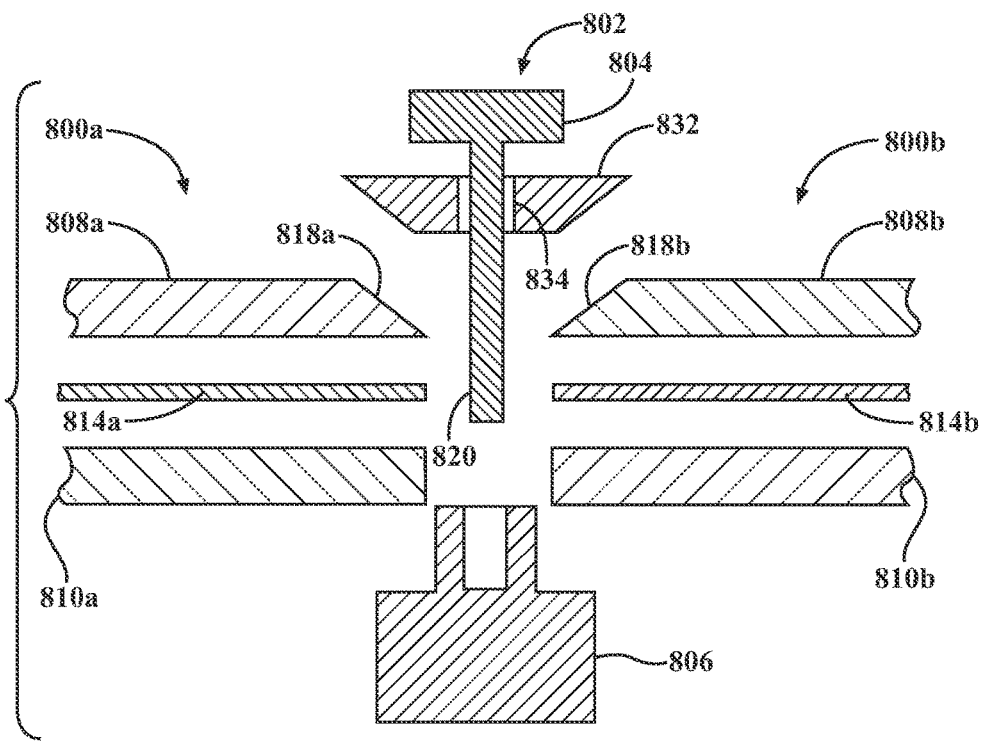
FIG. 8 shows an exploded sectional view of a fastener for clamping the two portions of laminated glass of FIG. 7.

FIG. 8 shows an exploded sectional view of a fastener 802 for clamping two laminated glass portions 800a,b together. The laminated glass portions 800a,b can be part of or similar to the laminated glass portions 700a,b of FIG. 7. The laminated glass portions 800a,b each include first glass panes 808a,b, second glass panes 810a,b, and interlayers 814a,b. Both laminated glass portions 800a,b also include recess portions 818a,b on upper surfaces. A trim element 832 is disposed within the recess portions 818a,b. In a manner similar to that shown for the trim element 732 of FIG. 7, the trim element 832 of FIG. 8 can extend for most of the length of the two laminated glass portions 800a,b in order to define a clamping surface against the two laminated glass portions 800a,b.

The trim element 832 also defines a bore 834, the bore 834 being configured to receive the fastener 802. The fastener 802 in FIG. 8 includes a fastener portion 804 that is disposed along an upper surface of the trim element 832 and a fastener portion 820 that extends from the fastener portion 804 through the bore 834 and along side surfaces of the two laminated glass portions 800a,b. The fastener 802 also includes a fastener portion 806 configured to capture the fastener portion 820 and clamp the two laminated glass portions 800a,b together in conjunction with the trim element 832. The trim element 832 can also include a recess portion (not shown) such that the fastener portion 804 sits within the recess portion of the trim element 832 once the clamp load is applied.

In FIG. 8, the fastener portion 820 is shown as a male portion and the fastener portion 806 is shown as a female portion, though other fastening schemes are also possible. In this example, the fastener portion 806 is also designed to extend along the side surfaces of the two laminated glass portions 800a,b when it captures the fastener portion 820. Again, the fastener portion 806 can be associated with, captured within, or extend from an underlying structure such as a vehicle pillar or a door frame such that the fastening system clamps the two laminated glass portions 800a,b to the underlying structure using the trim element 832.

Figure 9:
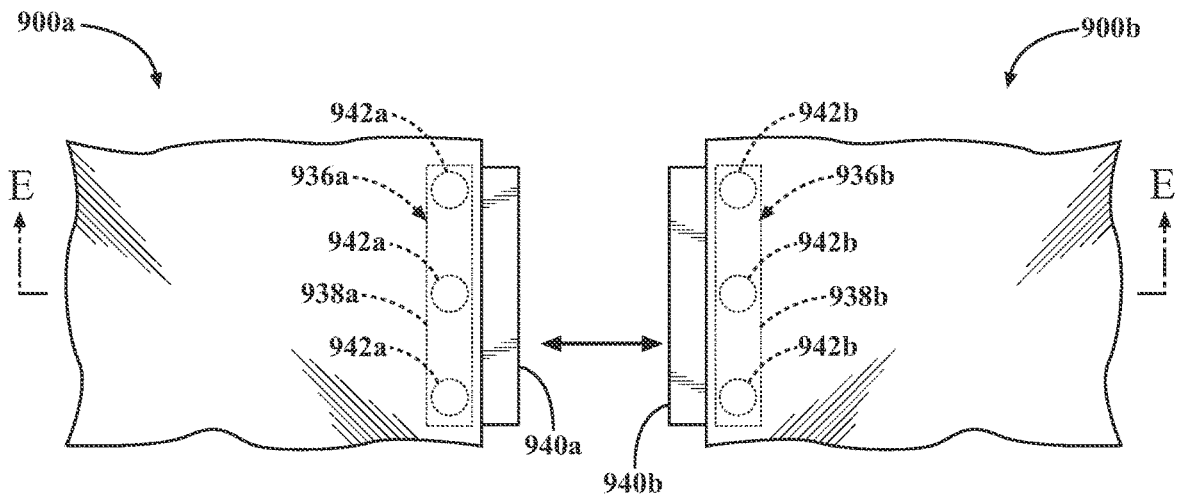
FIG. 9 shows a top view of a sealing juncture for two portions of laminated glass with at least one portion movable in respect to the other portion.

FIG. 9 shows a top view of a sealing juncture for two laminated glass portions 900a,b with at least one portion 900a movable in respect to the other portion 900b. Each of the laminated glass portions 900a,b includes an embedded seal 936a,b. The seals 936a,b include internal portions 938a,b, external portions 940a,b, and a plurality of connection portions 942a,b that extend from the internal portions 938a,b to the external portions 940a,b of the seals 936a,b. The sealing juncture is designed such that the external portion 940a can couple with the external portion 940b when the two laminated glass portions 900a,b are brought together, for example, in the case of moving window in the door of a vehicle. A section, E-E, is shown as extending through a pair of central connection portions 942a,b in the sealing system. A sectional view through section E-E for a connection portion similar to the central connection portions 942a,b is described in conjunction with FIG. 10 below.

Figure 10:
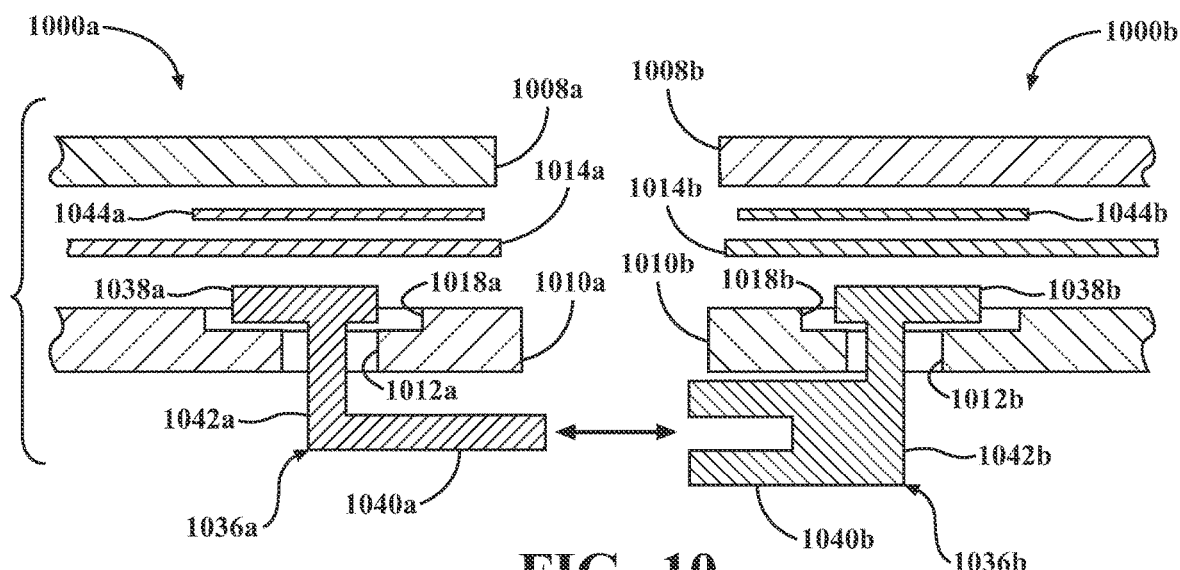
FIG. 10 shows an exploded sectional view of the sealing juncture of FIG. 9 with seals embedded during glass lamination.

FIG. 10 shows an exploded sectional view of the sealing juncture of FIG. 9. Each of the laminated glass portions 1000a,b in FIG. 10 includes a first glass pane 1008a,b, a second glass pane 1010a,b, and an interlayer 1014a,b disposed between the first and second glass panes 1008a,b, 1010a,b. The second glass panes 1010a,b define recessed portions 1018a,b and bores 1012a,b. The recessed portions 1018a,b can extend along the length of the second glass panes 1010a,b and the bores 1012a,b can be multiple and spaced along the recessed portions 1018a,b at predetermined intervals.

The laminated glass sealing system of FIG. 10 can include a pair of seals 1036a,b. The seals 1036a,b can include internal portions 1038a,b that extend along and are disposed within the recessed portions 1018a,b. The seals 1036a,b can also include external portions 1040a,b that are axially aligned with the internal portions 1030a,b and extend along an exterior surface of the second glass panes 1010a,b. In this example, the external portions 1040a,b also extend beyond the sides of the second glass panes 1010a,b, forming lips or edges for the seals 1036a,b outside of the second glass panes 1010a,b.

The seals 1036a,b can also include multiple connection portions 1042a,b, the connection portions 1042a,b extending through the bores 1012a,b from the internal portions 1038a,b to the external portions 1040a,b. The seals 1036a,b can be located prior to lamination, for example, by passing the external portions 1040a,b through the bores 1012a,b. Alternatively, the seals 1036a,b can be applied to the laminated glass portions 1000a,b after the lamination process, for example, using injection molding or another process configured to force the material of the seals into the recessed portions 1018a,b through the bores 1012a,b.

In operation of the sealing system of FIG. 10, the two external portions 1040a,b can be engaged by sliding the laminated glass portions 1000a,b toward each other in the same plane. In this example, the external portion 1040a is a male portion and the external portion 1040b is a female portion, though other coupling schemes are also possible. The laminated glass sealing system of FIG. 10 also includes a set of masks 1044a,b disposed between the first glass panes 1008a,b and the interlayers 1014a,b, the masks 1044a,b being axially aligned with the internal portions 1038a,b of the seals 1036a,b so as to block visibility of the seals 1036a,b from an external surface of the first glass panes 1008a,b. The masking feature is optional and serves to change the appearance of the laminated glass sealing system.

Figure 11:
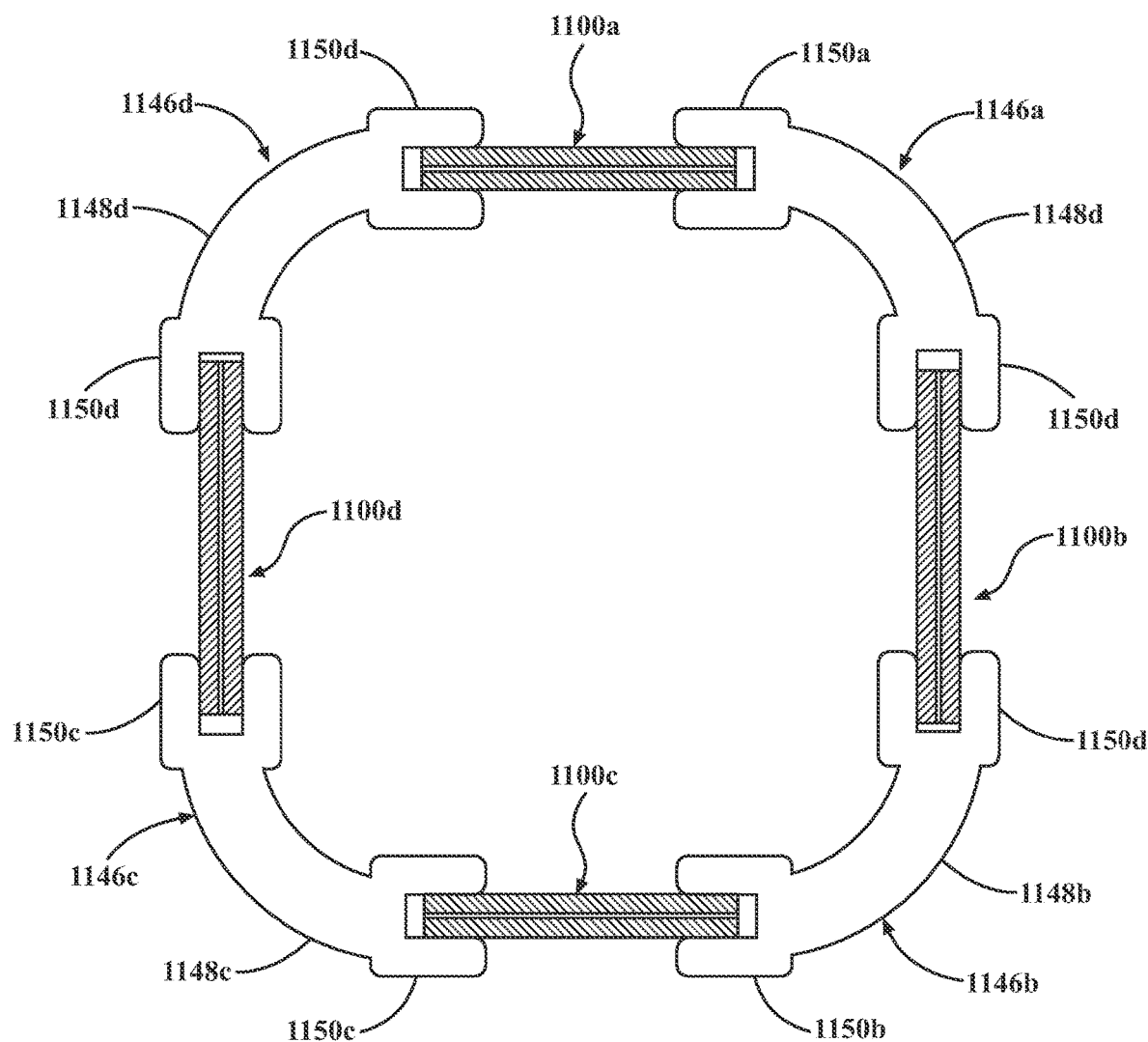
FIG. 11 shows a sectional view of laminated glass sections disposed within a ductile, structural overmold.

FIG. 11 shows a sectional view of laminated glass portions 1100a,b,c,d disposed within ductile, structural overmolds. In this example, the overmolds are support structures 1146a,b,c,d including support bodies 1148a,b,c,d extending between pairs of overmold sections 1150a,b,c,d, with each of the overmold sections 1150a,b,c,d capturing one end of the laminated glass portions 1100a,b,c,d. Though the example of FIG. 11 includes four laminated glass portions 1100a,b,c,d and four support structures 1146a,b,c,d coupled in a ring shape, other configurations are also possible.

The support structures 1146a,b,c,d can be formed of a non-glass material, such as a composites or a polymer with transparent properties, making both the laminated glass portions 1100a,b,c,d and the support structures 1146a,b,c,d transparent. The support structures 1146a,b,c,d can also be formed of a ductile material that allows deformation while at the same time providing sufficient stiffness to withstand outside forces acting upon the laminated glass portions 1100a,b,c,d without bending or buckling. These outside forces can be caused, for example, by winds from weather events, by impact from other structures, etc.

Figure 12:
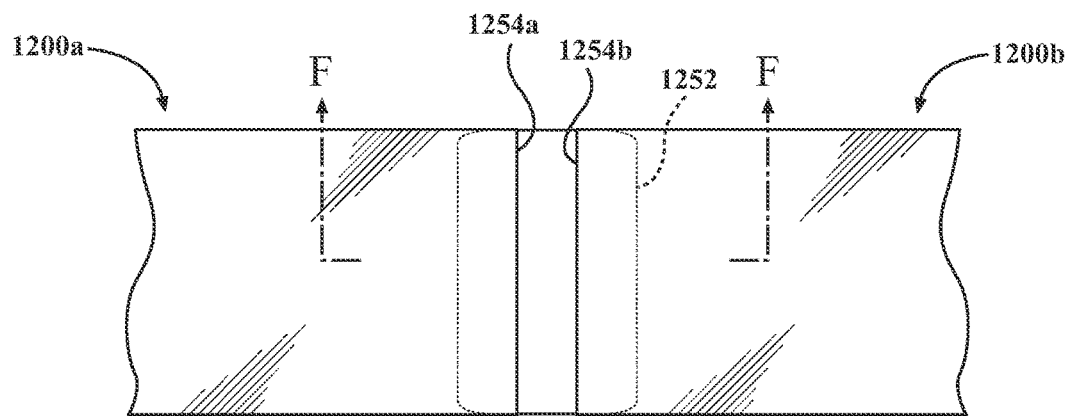
FIG. 12 shows a top view of another sealing juncture for two portions of laminated glass adhered to a support structure.

FIG. 12 shows a top view of another sealing juncture for two laminated glass portions 1200a,b adhered to a support structure 1252. The support structure 1252 can be, for example, a vehicle pillar, such as an a-pillar or a roof beam extending between a-pillars on a vehicle, or an architectural beam, such as a brace extending between a floor and a ceiling in a building. The sealing juncture can be designed such that an outer edge 1254a of the laminated glass portion 1200a is spaced from an outer edge 1254b of the laminated glass portion 1200b when the two laminated glass portions 1200a,b are adhered to the support structure 1252. The sealing juncture can also be designed such that both laminated glass portions 1200a,b overlap an upper surface of the support structure 1252 to allow for build tolerance variation when securing the laminated glass portions 1200a,b to the support structure 1252. A section, F-F, is shown as extending through the laminated glass portions 1200a,b and the support structure 1252 in the sealing system. Various sectional views through section F-F for a variety of sealing and attachments systems are described in conjunction with FIGS. 13-17 below.

Figure 13:
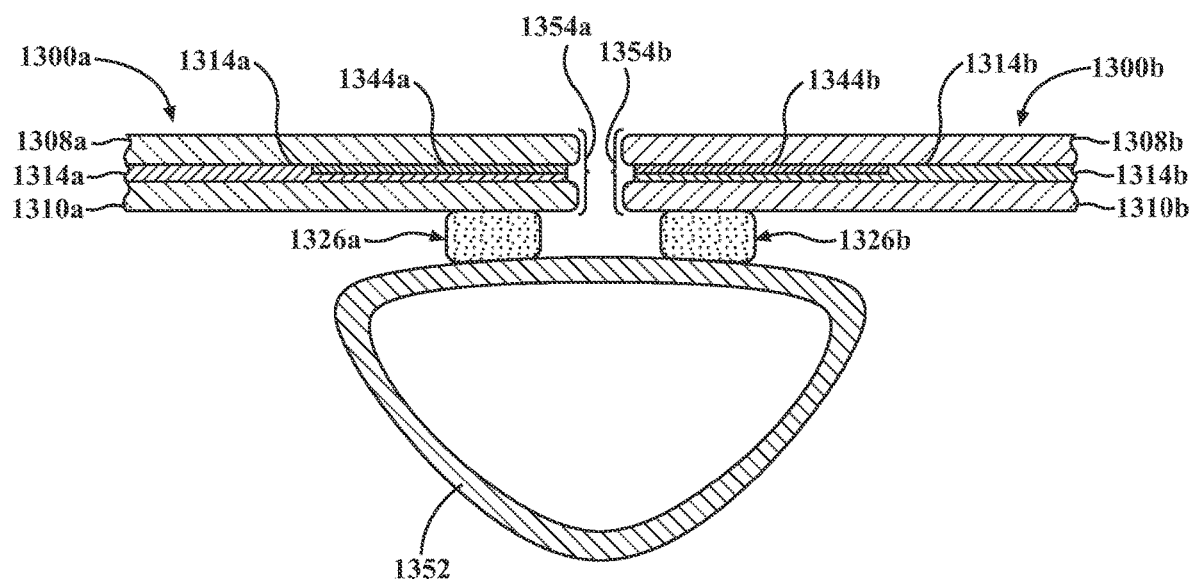
FIG. 13 shows a sectional view of the sealing juncture of FIG. 12 with masks embedded during glass lamination.

FIG. 13 shows a sectional view of the sealing juncture of FIG. 12 with masks 1344a,b embedded during glass lamination. The sealing juncture can include two glass portions 1300a,b having first glass panes 1308a,b, second glass panes 1310a,b, and interlayers 1314a,b. Though shown as laminated glass portions 1300a,b, other forms of glass or other transparent materials are also possible. Adhesive layers 1326a,b, for example, in the form of a thick, curable, compliant adhesive such as urethane, can be disposed on exterior surfaces of the glass portions 1300a,b in order to secure the glass portions 1300a,b to a support structure 1352. In the example of FIG. 13, the adhesive layers 1326a,b are positioned near outer edges 1354a,b of the glass portions 1300a,b such that the adhesive layers 1326a,b can be compressed against the support structure 1352 and, for example, cured or dried, in order to firmly secure the glass portions 1300a,b to the support structure 1352.

When being secured to the support structure 1352, the outer edges 1354a,b of the glass portions 1300a,b are generally aligned while at the same time slightly spaced in order to avoid contact between the outer edges 1354a,b. Additionally, a sufficient amount of overlap is designed between the glass portions 1300a,b and the support structure 1352 such that build variation in the support structure 1352 or placement of the adhesive layers 1326a,b does not impact sealing of the adhesive layers 1326a,b to the support structure 1352. Once the glass portions 1300a,b are secured to the support structure 1352, the visual effect becomes one of floating glass, with both the support structure 1352 and the adhesive layers 1326a,b visible through the glass portions 1300a,b.

In the case where viewing the adhesive layers 1326a,b is not desirable or the adhesive requires isolation from solar radiation, the glass portions 1300a,b can be designed with integrated masks 1344a,b, for example, of a color or style matching, coordinating with, or otherwise complementing the support structure 1352 or other design features of the overall structure in which the glass portions 1300a,b are installed. The masks 1344a,b can be laminated between the respective glass panes 1308a,b, 1310a,b or can be applied to an exterior surface of the glass portions 1300a,b. When applied, the masks 1344a,b are designed for axial alignment with the adhesive layers 1326a,b such that the adhesive layers 1326a,b are not visible through the glass portions 1300a,b. The masks 1344a,b can include any number of colors, materials, or design features so as to both cover the adhesive layers 1326a,b and provide a pleasing visual effect.

Figure 14:
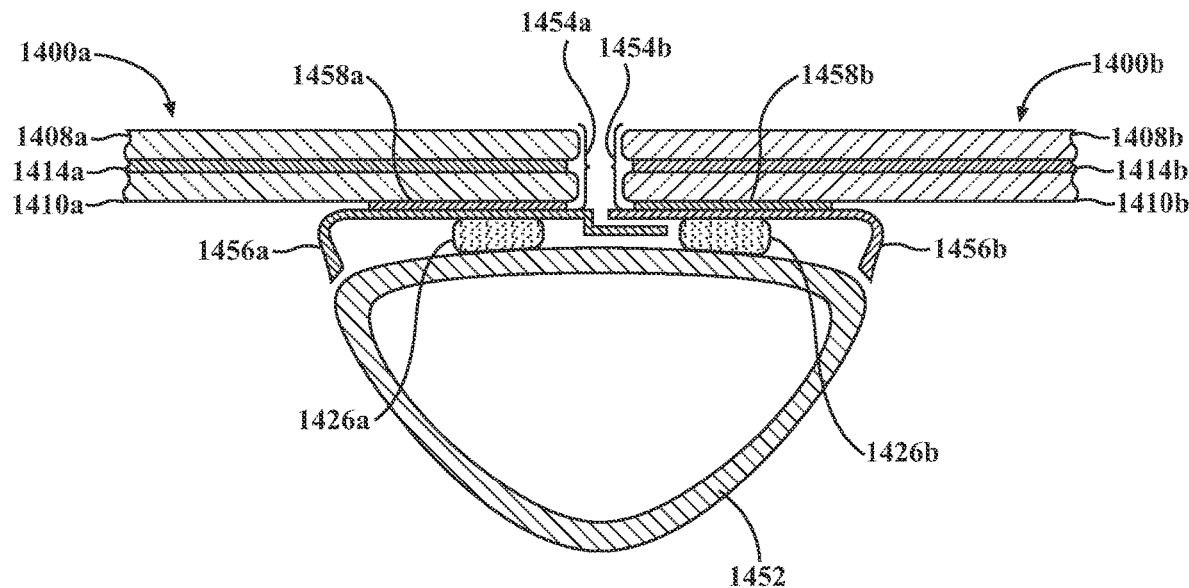
FIG. 14 shows a sectional view of the sealing juncture of FIG. 12 with overlapping covers adhered to the glass for adhesion to the support structure.

FIG. 14 shows a sectional view of the sealing juncture of FIG. 12 with overlapping covers 1456a,b adhered to glass portions 1400a,b for adhesion to an underlying support structure 1452. The sealing juncture can include two glass portions 1400a,b having first glass panes 1408a,b, second glass panes 1410a,b, and interlayers 1414a,b. Though shown as laminated glass portions 1400a,b, other forms of glass or other transparent materials are also possible. Thin, transparent adhesive layers 1458a,b can be applied to exterior surfaces of the glass portions 1400a,b in order to secure the covers 1456a,b to the glass portions 1400a,b. The transparent adhesive layers 1458a,b can be designed with little or no compliance in order to rigidly secure the covers 1456a,b to the glass portions 1400a,b.

The covers 1456a,b in the example of FIG. 14 are elongated panels having opposing surfaces, the first surfaces being secured to the transparent adhesive layers 1458a,b, and the second or opposing surfaces being configured to receive compliant adhesive layers 1426a,b similar to the adhesive layers 1326a,b described in reference to FIG. 13. The covers 1456a,b can be shaped in variety of ways or formed from a variety of materials, such as plastic, steel, aluminum, or composite, so as to create a desired visual effect when viewed from either side of the glass portions 1400a,b. The covers 1456a,b are designed to extend beyond outer edges 1454a,b of the glass portions 1400a,b when secured by the transparent adhesive layers 1458a,b to obscure the support structure 1452 from view through one side of the glass portions 1400a,b.

Once the compliant adhesive layers 1426a,b are applied to the covers 1456a,b, the glass portions 1400a,b can be positioned such that the extending portions of the covers 1456a,b either meet or overlap, and the combination of the glass portions 1400a,b and the covers 1456a,b can be compressed against the support structure 1452 to complete the sealing juncture. When the glass portions 1400a,b are secured to the support structure 1452, the covers 1456a,b extend from opposing edges of the support structure 1452 to positions beyond the outer edges 1454a,b of the glass portions 1400a,b, completely obscuring the compliant adhesive layers 1426a,b from view from either side of the glass portions 1400a,b.

Figure 15:
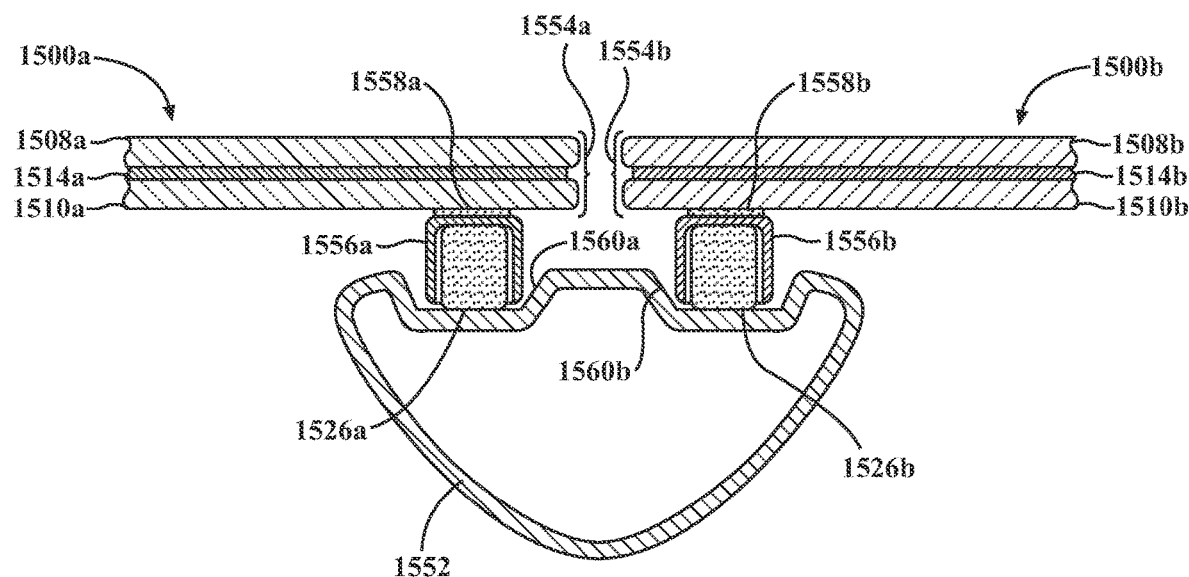
FIG. 15 shows a sectional view of the sealing juncture of FIG. 12 with spaced covers adhered to the glass for adhesion to the support structure.

FIG. 15 shows a sectional view of the sealing juncture of FIG. 12 with spaced covers 1556a,b adhered to glass portions 1500a,b for adhesion to an underlying support structure 1552. The sealing juncture can include two glass portions 1500a,b having first glass panes 1508a,b, second glass panes 1510a,b, and interlayers 1514a,b. Though shown as laminated glass portions 1500a,b, other forms of glass or other transparent materials are also possible. Transparent adhesive layers 1558a,b can be applied to exterior surfaces of the glass portions 1500a,b in order to secure the covers 1556a,b to the glass portions 1500a,b. The transparent adhesive layers 1558a,b can be designed to be thin, with little or no compliance, or to be thicker, having some compliance. In either design, the transparent adhesive layers 1558a,b can firmly secure the covers 1556a,b to the glass portions 1500a,b.

The covers 1556a,b in the example of FIG. 15 are c-shaped channels having opposing surfaces, the first surfaces being secured to the transparent adhesive layers 1558a, b, and the second or opposing surfaces being configured to receive compliant adhesive layers 1526a,b. The shape of the covers 1556a,b allows the channels to be filled with the compliant adhesive layers 1526a,b. The support structure 1552 can be designed with recesses 1560a,b configured to receive the covers 1556a,b filled with the compliant adhesive layers 1526a,b, that is, the covers 1556a,b can be inserted, at least partially, within the recesses 1560a,b in the support structure 1552. To secure the glass portions 1500a,b to the support structure 1552, the compliant adhesive layers 1526a,b that fill the channels in the covers 1556a,b can be compressed against bottom surfaces of the recesses 1560a,b in the support structure 1552.

Though the covers 1556a,b in FIG. 15 are shown as protruding slightly from the recesses 1560a,b when the sealing juncture is complete, the covers 1556a,b can be designed to be flush with the top of the recesses 1560a,b or to protrude further from the recesses 1560a,b when installed. In any of these configurations, the covers 1556a,b can completely obscure the compliant adhesive layers 1526a,b from view while at the same time providing a striped visual effect when viewed from one side of the glass portions 1500a,b. The location of the recesses 1560a,b in the support structure 1552 can modify the visual effect. Additionally, the recesses 1560a,b can be shaped such that the compliant adhesive layer 1526a,b can be removed when necessary, for example, using a thin angled tool, such as a vehicle trim tool in the case where the support structure 1552 is a vehicle pillar.

Figure 16:
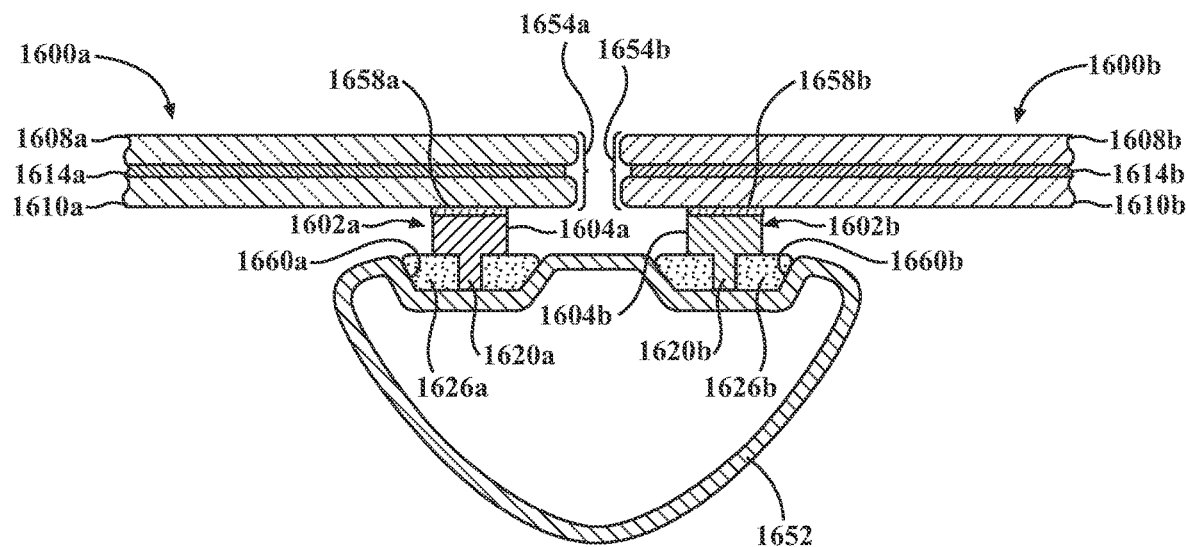
FIG. 16 shows a sectional view of the sealing juncture of FIG. 12 with fasteners extending from the laminated glass into the support structure.

FIG. 16 shows a sectional view of the sealing juncture of FIG. 12 with fasteners 1602a,b extending from glass portions 1600a,b into a support structure 1652. The sealing juncture can include two glass portions 1600a,b having first glass panes 1608a,b, second glass panes 1610a,b, and interlayers 1614a,b. Though shown as laminated glass portions 1600a,b, other forms of glass or other transparent materials are also possible. Transparent adhesive layers 1658a,b can be applied to exterior surfaces of the glass portions 1600a,b in order to secure first portions 1604a,b of the fasteners 1602a,b to the glass portions 1600a,b. The transparent adhesive layers 1658a,b can be designed to be thin, with little or no compliance, in order to rigidly secure the first portions 1604a,b to the glass portions 1600a,b.

The fasteners 1602a,b in the example of FIG. 16 include both the first portions 1604a,b secured to the transparent adhesive layers 1658a,b and second portions 1620a,b extending from the respective first portions 1604a,b away from the transparent adhesive layers 1658a,b. The support structure 1652 can be designed with bores or recesses 1660a,b configured to receive the second portions 1620a,b of the fasteners 1602a,b. In one embodiment, the recesses 1660a,b in the support structure 1652 can be filled with compliant adhesive layers 1626a,b configured to receive the second portions 1620a,b of the fasteners 1602a,b in order to secure the glass portions 1600a,b to the support structure 1652. In another embodiment (not shown) the recesses 1660a,b can include other forms of retainers, such as bushings, configured to receive the second portions 1620a,b of the fasteners 1602a,b.

The first portions 1604a,b of the fasteners 1602a,b can be visible through the glass portions 1600a,b and can be shaped or styled such that the second portions 1620a,b of the fasteners 1602a,b as well as the compliant adhesive layers 1626a,b are obscured when viewed from one side of the glass portions 1600a,b. The location of the fasteners 1602a,b adhered to the glass portions 1600a,b and the location of the recesses 1660a,b in the support structure 1652 can be changed to modify the visual effect. The recesses 1660a,b can be shaped such that the compliant adhesive layers 1526a,b, and in turn, the second portions 1620a,b of the fasteners 1602a,b can be removed when necessary, for example, using a thin angled tool, such as a vehicle trim tool.

Figure 17:
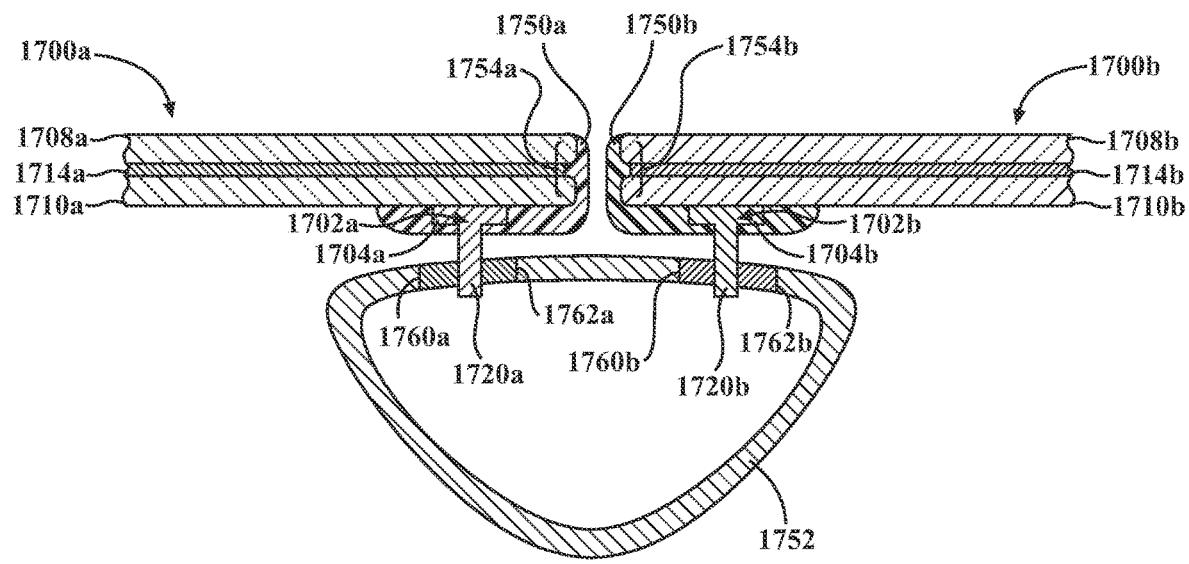
FIG. 17 shows a sectional view of the sealing juncture of FIG. 12 with fasteners extending from an overmold into the support structure.

FIG. 17 shows a sectional view of the sealing juncture of FIG. 12 with fasteners 1702a,b extending from overmolds 1750a,b into a support structure 1752. The sealing juncture can include two glass portions 1700a,b having first glass panes 1708a,b, second glass panes 1710a,b, and interlayers 1714a,b. Though shown as laminated glass portions 1700a,b, other forms of glass or other transparent materials are also possible. The overmolds 1750a,b can be applied, for example, using an encapsulation process, to edges 1754a,b of the glass portions 1700a,b. The overmolds 1750a,b can be designed to secure first portions 1704a,b of the fasteners 1702a,b to the glass portions 1700a,b and create a visual feature along the edges 1754a,b.

The fasteners 1702a,b in the example of FIG. 17 include both the first portions 1704a,b embedded or captured within the overmolds 1750a,b and second portions 1720a,b extending perpendicularly from the first portions 1704a,b out of the overmolds 1750a,b. The support structure 1752 can be designed with bores or recesses 1760a,b configured to receive the second portions 1720a,b of the fasteners 1702a, b. In the example of FIG. 17, the recesses 1760a,b can be designed to hold or receive retainers, such as bushings 1762a,b, configured to capture the second portions 1720a,b of the fasteners 1702a,b. Though the retainers shown are bushings 1762a,b, other forms of retainers such as clips, adhesives, or clamps are also possible.

The first portions 1704a,b of the fasteners 1702a,b can be visible through the glass portions 1700a,b and can be positioned within the overmolds 1750a,c as desired to modify the visual effect of the fasteners 1702a,b. The interface between the overmolds 1750a,b and the support structure 1752 can be designed such that the second portions 1720a,b of the fasteners 1702a,b can be removed from the support structure 1752 when necessary, for example, by designing a gap between the overmolds 1750a,b and the support structure 1752 when the fasteners 1702a,b are secure. In the embodiment shown in FIG. 17, the fasteners 1702a,b are located at discrete points within the overmold 1750a,b. In an alternative embodiment (not shown), the second portions 1720a,b of the fasteners 1702a,b can be located at discrete points while the first portions 1704a,b of the fasteners 1702a,b are formed as strips or bars, creating a striped effect when viewed through the glass portions 1700a,b.

Figure 18:
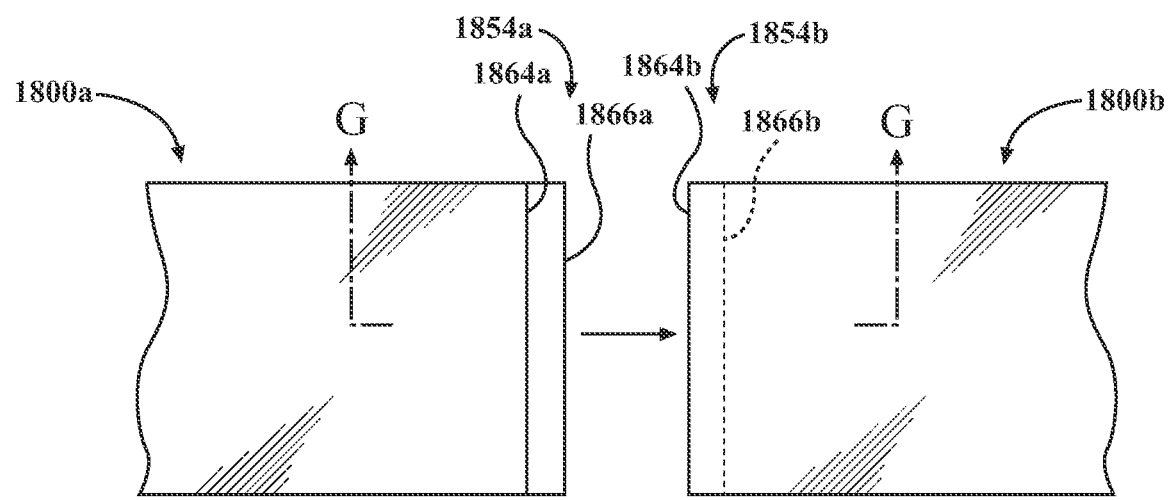
FIG. 18 shows a top view of another sealing juncture for two portions of laminated glass with at least one portion movable in respect to the other portion.

FIG. 18 shows a top view of another sealing juncture for two glass portions 1800a,b with one glass portion 1800a movable in respect to the other glass portion 1800b. The glass portions 1800a,b include first edge portions 1864a,b and second edge portions 1866a,b that are offset from the first edge portions 1864a,b. The sealing juncture is designed such that the when the glass portion 1800a moves toward the glass portion 1800b, the first edge portions 1864a,b align and the second edge portions 1866a,b align when the two glass portions 1800a,b are brought together, for example, in the case of a moving window in the door of a vehicle. A section, G-G, is shown as extending through the glass portions 1800a,b in the sealing system. Various sectional views through section G-G for a variety of sealing systems are described in conjunction with FIGS. 19-20 below.

Figure 19:
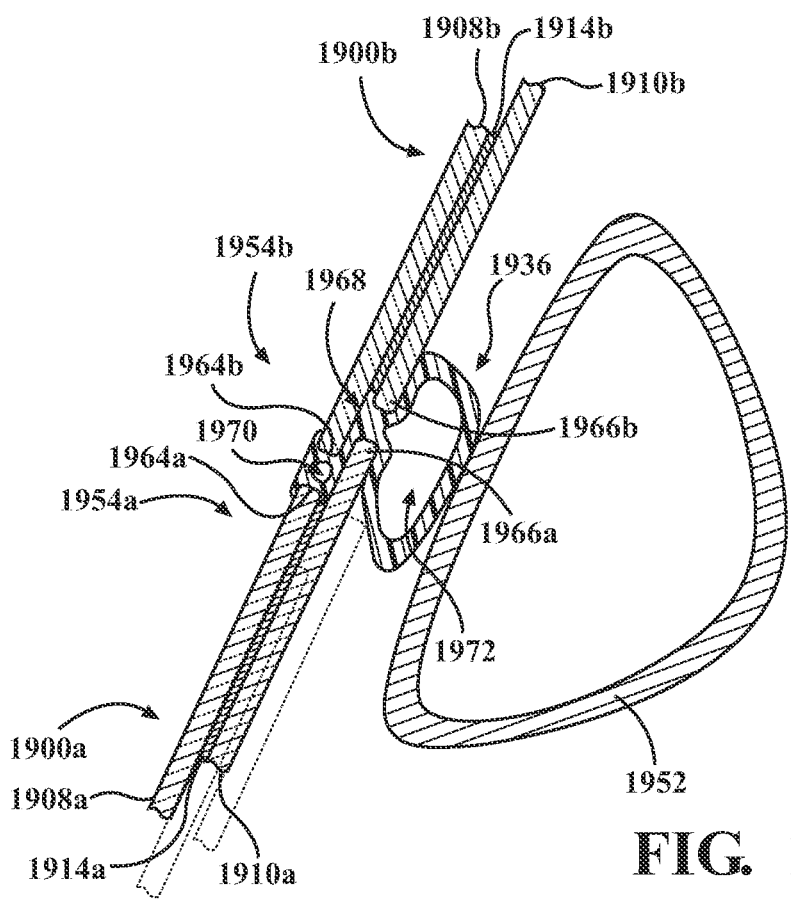
FIG. 19 shows a sectional view of the sealing juncture of FIG. 18 with an overmolded seal disposed on one of the glass portions.

FIG. 19 shows a sectional view of the sealing juncture of FIG. 18 with an overmolded seal 1936 disposed between glass portions 1900a,b. Each of the glass portions 1900a,b in FIG. 19 includes a first glass pane 1908a,b, a second glass pane 1910a,b, an interlayer 1914a,b disposed between the first and second glass panes 1908a,b, 1910a,b, and edges 1954a,b defining first edge portions 1964a,b offset from second edge portions 1966a,b. The offset of the first edge portion 1964a and the second edge portion 1966a is in the opposite direction from the offset of the first edge portion 1964b and the second edge portion 1966b such that the two glass portions 1900a,b can align in an interlocking manner when one moves toward the other. The offset is beneficial, for example, in situations where pressure differentials inside and outside of the sealing juncture pull the edges 1954a,b of the glass portions 1900a,b apart, such as in a vehicle traveling at higher speeds.

The seal 1936 in FIG. 19 can include an overmold portion 1968 that captures the first edge portion 1964b and the second edge portion 1966b of the glass portion 1900b, for example, by encapsulation. The seal 1936 can also include a compressible portion that extends from the overmold portion 1968. In this example, the compressible portion includes a first bulb portion 1970 configured to sealingly engage the first edge portions 1964a,b of the glass portions 1900a,b under compression and a second bulb portion 1972 configured to sealingly engage the second edge portions 1966*a,b* of the glass portions 1900*a,b* and the support structure 1952 under compression. In operation of the sealing system of FIG. 19, the glass portions 1900*a,b* can be sealed against the support structure 1952 by sliding the glass portion 1900*a* toward the glass portion 1900*b*. Once slid together, the first edge portion 1964*a* of the glass portion 1900*a* engages the first bulb portion 1970 and the second edge portion 1966*a* of the glass portion 1900*a* engages the second bulb portion 1972. The second bulb portion 1972 is compressed in a manner which in turn engages the support structure 1952 as shown.

Figure 20:
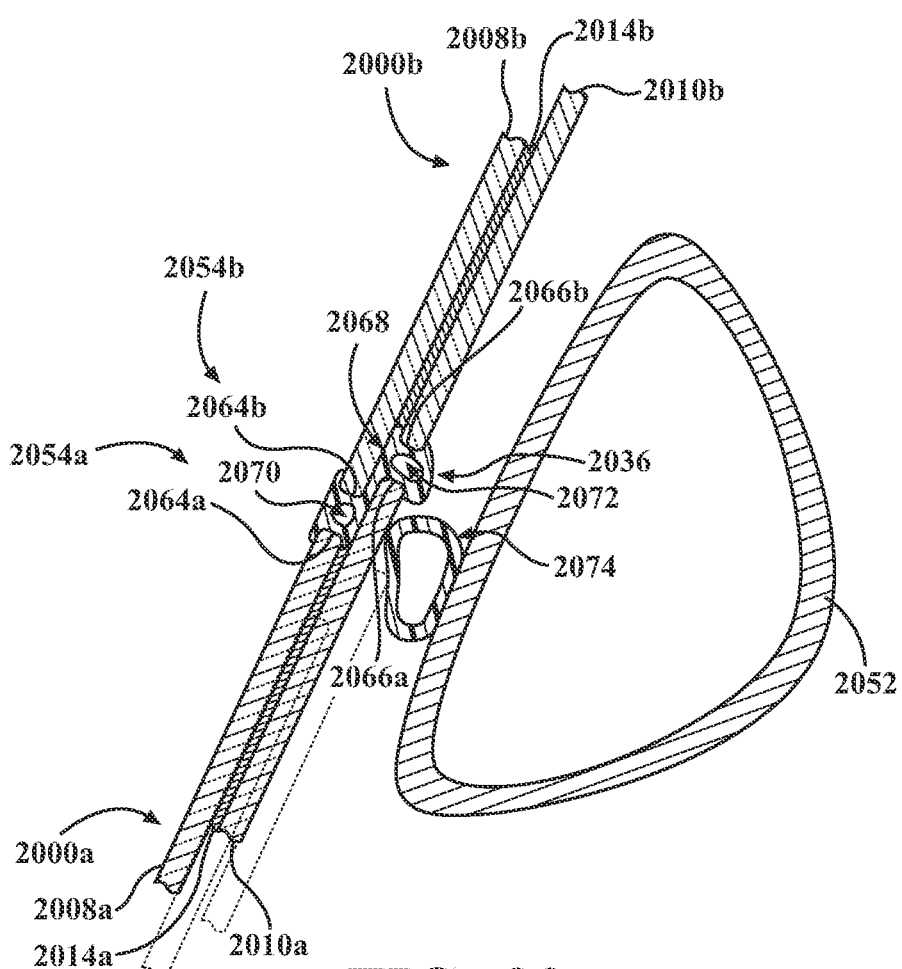
FIG. 20 shows a sectional view of the sealing juncture of FIG. 19 with another overmolded seal disposed on one of the glass portions.

FIG. 20 shows a sectional view of the sealing juncture of FIG. 18 with another overmolded seal 2036 disposed between glass portions 2000*a,b*. Each of the glass portions 2000*a,b* in FIG. 20 includes a first glass pane 2008*a,b*, a second glass pane 2010*a,b*, an interlayer 2014*a,b* disposed between the first and second glass panes 2008*a,b*, 2010*a,b*, and edges 2054*a,b* defining first edge portions 2064*a,b* offset from second edge portions 2066*a,b*. The offset of the first edge portion 2064*a* and the second edge portion 2066*a* is in the opposite direction from the offset of the first edge portion 2064*b* and the second edge portion 2066*b* such that the two glass portions 2000*a,b* can align in an interlocking manner when one moves toward the other, as was described in reference to FIG. 19.

The seal 2036 in FIG. 20 can include an overmold portion 2068 that captures the first edge portion 2064*b* and the second edge portion 2066*b* of the glass portion 2000*b*, for example, by encapsulation. The seal 2036 can also include a pair of compressible portions that extend from the overmold portion 2068. In this example, a first bulb portion 2070 is configured to sealingly engage the first edge portions 2064*a,b* of the glass portions 2000*a,b* under compression and a second bulb portion 2072 is configured to sealingly engage the second edge portions 2066*a,b* of the glass portions 2000*a,b* under compression. To guide the glass portions 2000*a,b* together and to seal the glass portions 2000*a,b* to the support structure 2052, the sealing system includes another seal 2074 disposed on the support structure 2052. In operation, the glass portions 2000*a,b* can be sealed against the support structure 2052 by sliding the glass portion 2000*a* toward the glass portion 2000*b*. Once slid together, the first edge portion 2064*a* of the glass portion 2000*a* engages the first bulb portion 2070 and the second edge portion 2066*a* engages the second bulb portion 2072. The second glass pane 2010*a* also compresses the seal 2074 attached to the support structure 2052.

What is claimed is:

1. A glass fastening system, comprising:
    a glass portion;
    a support structure defining a recess;
    an overmold secured to a side surface of the glass portion and an exterior surface of the glass portion that faces the support structure;
    a retainer disposed within the recess of the support structure;
    a fastener having a fastener head secured to the exterior surface of the glass portion by and within the overmold at a location spaced from the side surface of the glass portion and a fastener shaft protruding from the overmold, extending away from the fastener head, and extending into the retainer to secure the glass portion to the support structure; and
    a gap defined between an exterior surface of the overmold and a top of the retainer, wherein the fastener shaft is exposed within the gap and extends across the gap between the overmold and the retainer,
    wherein the retainer includes an adhesive that secures the glass portion to the support structure via the fastener shaft.

2. The glass fastening system of claim 1, wherein the gap provides access to the fastener shaft between the overmold and the support structure to allow removal of the fastener from the support structure.

3. The glass fastening system, wherein the adhesive is compliant, compressibly securing the glass portion.

4. The glass fastening system of claim 3, wherein the adhesive fills an entirety of the recess in the support structure.

5. The glass fastening system of claim 1, wherein the overmold is secured only to the side surface of the glass portion and the exterior surface of the glass portion that faces the support structure.

6. The glass fastening system of claim 1, wherein the overmold obscures the fastener shaft and the retainer from a view looking through the glass portion toward the support structure.

7. The glass fastening system of claim 1, wherein the retainer includes a bushing disposed in the recess and configured to receive the fastener shaft of the fastener.

8. The glass fastening system of claim 1, wherein the glass portion is a laminated glass portion comprising a first glass pane, a second glass pane, and an interlayer disposed therebetween.

9. A glass fastening system, comprising:
    a glass portion;
    a support structure defining a recess;
    an adhesive disposed within the recess of the support structure; and
    a fastener having a fastener head secured to the glass portion via an overmold and a fastener shaft extending away from the fastener head and into the adhesive to secure the glass portion to the support structure,
    wherein a gap separates the overmold and the adhesive and allows access to the fastener shaft to support removal of the fastener when the glass portion is secured to the support structure.

10. The glass fastening system of claim 9, wherein the adhesive is compliant and compressibly secures the glass portion to the support structure via the fastener shaft.

11. The glass fastening system of claim 9, wherein the overmold is secured to only a side surface of the glass portion and an exterior surface of the glass portion that faces the support structure.

12. The glass fastening system of claim 9, wherein the overmold obscures the adhesive from a view looking through the glass portion toward the support structure.

13. The glass fastening system of claim 9, wherein the glass portion is a laminated glass portion comprising a first glass pane, a second glass pane, and an interlayer disposed therebetween.

14. A glass fastening system, comprising:
    first and second glass portions;
    a support structure;
    first and second recesses defined in the support structure;
    first and second retainers disposed within the first and second recesses of the support structure;
    first and second fasteners having fastener heads secured to the first and second glass portions via first and second overmolds and fastener shafts extending away from the fastener heads and into the first and second retainers to secure the first and second glass portions to the support structure;

a first gap defined between the first and second glass portions that separates side surfaces of the first and second overmolds; and a second gap defined between the first and second overmolds and the first and second retainers, wherein the second gap provides access to the fastener shafts of the first and second fasteners to support removal of the first and second fasteners when the first and second glass portions are secured to the support structure.

15. The glass fastening system of claim 14, wherein the first and second retainers include an adhesive that is compliant and compressibly secures the first and second glass portions to the support structure via the fastener shafts of the first and second fasteners.

16. The glass fastening system of claim 15, wherein the adhesive fills an entirety of the first and second recesses in the support structure.

17. The glass fastening system of claim 16, wherein the first and second overmolds obscure the adhesive from a view looking through the first and second glass portions toward the support structure.

18. The glass fastening system of claim 14, wherein the first and second retainers include first and second bushings disposed in first and second recesses, and wherein the first and second bushings are configured to receive the fastener shafts of the first and second fasteners.

19. The glass fastening system of claim 14, wherein the first and second glass portions are laminated glass portions comprising first glass panes, second glass panes, and interlayers disposed therebetween.

20. The glass fastening system of claim 14, wherein the first and second overmolds are secured only to side surface of the first and second glass portions and exterior surfaces of the first and second glass portions that face the support structure.

* * * * *